Figure 1:
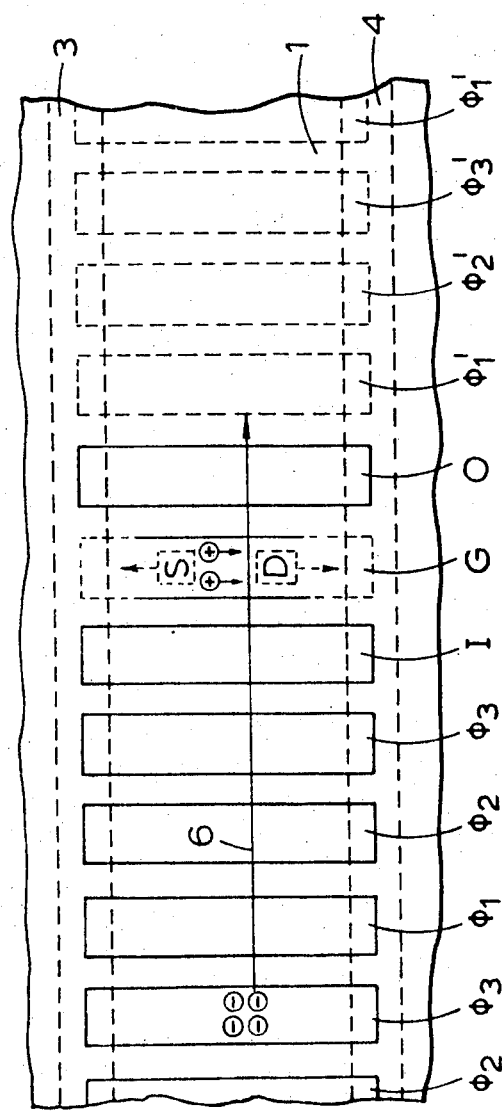

United States Patent [19]
Brewer

[11] 4,074,302
[45] Feb. 14, 1978

[54] BULK CHANNEL CHARGE COUPLED SEMICONDUCTOR DEVICES

[75] Inventor: Robert J. Brewer, Carshalton, England

[73] Assignee: U.S. Philips Corporation, New York, N.Y.

[21] Appl. No.: 688,008

[22] Filed: May 19, 1976

[30] Foreign Application Priority Data

June 26, 1975 United Kingdom ............... 27093/75
Nov. 27, 1975 United Kingdom ............... 48894/75

[51] Int. Cl.² ..................... H01L 29/78; H01L 29/04; G11C 19/28
[52] U.S. Cl. ................................ 357/24; 307/221 D; 357/59
[58] Field of Search ............. 357/24; 307/221 D, 304

[56] References Cited

U.S. PATENT DOCUMENTS

| 3,739,240 | 6/1973 | Krambeck | 357/24 |
| 3,918,070 | 11/1975 | Shannon | 357/24 |
| 3,987,475 | 10/1976 | Ibrahim | 357/24 |
| 4,032,952 | 6/1977 | Ohba et al. | 357/24 |

OTHER PUBLICATIONS

Board et al., "CCFET: An Active Charge-Coupled Device", Electronics Letters, vol. 11 (9/75), pp. 452–453.

*Primary Examiner*—William D. Larkins
*Assistant Examiner*—Gene M. Munson
*Attorney, Agent, or Firm*—Frank R. Trifari; Jack Oisher; Steven R. Biren

[57] ABSTRACT

A semiconductor device includes a semiconductor body having a semiconductor layer of one conductivity type, means for enabling the semiconductor layer to be locally fully depleted without avalanche multiplication in order to allow the movement of majority charge carriers representative of information via the interior of the layer to one or more storage sites in the layer, means for enabling the reading of information present at least in one storage site comprising an insulated gate field effect transistor structure having its channel region present at the surface of the semiconductor layer above said one storage site and between source and drain regions of the opposite conductivity type, and means for enabling the temporary confinement of the quantity of majority charge carriers in said one storage site to the interior of the layer without mixing of the stored charge carriers in said one storage site and the mobile minority charge carriers in the transistor channel in order that the current flow in the transistor channel when the transistor gate electrode is maintained at any given potential is dependent upon the quantity of charge in the said one storage site. Various semiconductor devices, particularly of the type referred to as bulk channel charge coupled devices, are disclosed, including a charge coupled imaging device, a device having a relatively high charge handling capacity, a photo-detector, a tapped delay line, a random access memory and an image display device.

34 Claims, 24 Drawing Figures

BULK CHANNEL CHARGE COUPLED SEMICONDUCTOR DEVICES

This invention relates to semiconductor devices, particularly but not exclusively to charge coupled devices of the kind in which charge representative of information is transported between storage sites in a semiconductor layer via the interior of the layer. Normally the charge representative of information is in the form of majority carriers, that is in the form of charge carriers which are in the majority in the semiconductor layer in the case that the layer is electrically neutral. Such charge coupled devices are sometimes referred to as bulk channel charge coupled devices and differ from so-called surface channel charge coupled devices in which the charge transport between storage sites takes place adjacent the surface of a semiconductor layer at the insulating layer/semiconductor interface. Bulk channel charge coupled devices have various advantages of which the principle one is that in a transfer operation between adjoining storage sites the transfer of the last fraction of a charge packet takes place at a substantial distance from the surface of the semiconductor layer in the bulk of the layer where the drift fields are appreciably higher than at the insulating layer/semiconductor interface. This results in much shorter transfer times. As the transfer of charge is not at the semiconductor/insulating layer interface the surface states have no effect on the charge transfer efficiency as in the case in a surface channel charge coupled device.

For reading the information as represented by a charge packet in a charge coupled device various different structures are known and the use of any one such structure depends on the form of the charge coupled device, its particular application and the charge detection sensitivity requirements imposed by the particular application. Thus, for example, when a charge coupled device is constructed for low light level imaging purposes there is a basic requirement for a high charge detection sensitivity. This requirement also exists in some signal processing charge coupled devices.

In surface channel charge coupled devices one commonly employed charge reading means is the so-called floating gate amplifier. This structure comprises the provision of an insulated gate field effect transistor structure in the same semiconductor body as the channel along which the signal charge is transferred but with the source and drain regions of the transistor isolated from the signal charge transfer channel and the gate of the transfer electrically floating and having a part extending above and insulated from the charge transfer channel. A bias electrode forming part of the electrode system provided for the charge transfer process is provided above and insulated from the extension of the floating gate above the signal charge transfer channel. The potential of the floating gate electrode is modulated by underlying signal charge in the channel via the capacitive coupling between the floating gate and the underlying semiconductor surface region containing the signal charge. This modulation of the potential of the floating gate in turn is used to proportionately modulate the source-drain current of the insulated gate field effect transistor which is therefore a measure of the size of the charge packet adjacent the semiconductor surface below the extension of the floating gate. The floating gate amplifier is advantageous in so far as it is a non-destructive read-out means and that the total capacitance of the floating gate may be kept within reasonable limits. However for use in a bulk channel charge coupled device where a high detection sensitivity is required with low noise a floating gate amplifier read-out stage is not entirely satisfactory because the larger separation between the floating gate and the charge storage site in the interior of the layer reduces the modulation of the potential of the floating gate by the charge carriers. This reduces the signal to noise ratio.

Another charge reading structure that has been proposed for use in the surface channel charge coupled devices is the so-called distributed floating gate amplifier. This stucture is effectively an array of floating gate amplifiers provided along one signal charge transfer line with additive outputs provided along an auxiliary charge transfer line at the end of which there is an output amplifier. In theory the distributed floating gate amplifier enables a considerable improvement in the signal to noise ratio by a factor equal to the square root of the number of stages compared with a single stage floating gate amplifier. However a disadvantage arises in that as in each stage theme is a floating gate electrode which is buried between insulating layers there will be an intermediate amount of fixed charge on each gate and it is not readily possible to control the device processing so that the amount of this fixed charge is constant for all the gates. A variation in the amount of fixed charge on the gates of the different stages can give rise to a variation in the gain of the different stages which results in the improvement in signal to noise ratio compared to a single stage floating gate amplifier being less than the said factor. Furthermore such a structure is normally operated with a potential difference between the floating gates and the bias electrode which passes over and is nominally insulated from parts of the floating gates. Due to leakage currents between this bias electrode and the floating gates the charge on the floating gates will change with time, usually by unequal amounts, thus resulting in further variations in the gain of the different stages. When used with a bulk channel charge coupled device this structure is also less sensitive due to the increased separation between the floating gates and the charge storage sites in the interior of the semiconductor layer.

Another read-out means for a charge coupled device in which the charge is transported via the interior of the semiconductor layer is described in U.K. Patent Application No. 48980/72 which corresponds to U.S. application Ser. No. 299,748. This comprises the provision of a first more highly doped surface region adjacent a clocking electrode at the end of a signal charge transfer channel. The first more highly doped surface region which is of the same conductivity type as the signal charge transfer channel is connected to the gate electrode of an insulated gate field effect transistor provided in the semiconductor body beyond the signal charge transfer channel. A second more highly doped surface region of said same conductivity type is provided, and a further electrode extending across the entire width of the channel is provided, overlapping and separating the two more highly doped surface regions. In operation the said second more highly doped surface region is connected to a reference potential. In this read-out stage a charge packet introduced into the layer part of the semiconductor body comprising the first more highly doped surface region is used to change the potential of the gate electrode of the transistor which in turn modulates the source-drain current of the transistor. The first and second more highly doped surface regions and the further electrode constitute a deep depletion field effect transistor provided for draining the charge. This charge detection structure suffers from the disadvantage that the first more highly doped surface region has a high capacitance and thus the potential modulation is small for a given charge packet. This may result in a poor signal to noise ratio. Furthermore, in operation after sensing a charge packet which is introduced into the first more highly doped surface region the charge packet has to be removed via the charge draining means formed by the deep depletion field effect transistor structure. This charge removal has associated noise.

In known charge coupled devices already referred to the read-out means are generally provided at or adjacent the end of a line of charge storage and transfer bits. However for some applications it would be beneficial to construct a charge coupled device in which non-destructive read-out of stored charge can be achieved at a plurality of the bits in the line. One such application is provision of a tapped delay line. Another is the provision of a memory device. The requirement exists of being able to provide read-out means at a plurality of bits in a charge transfer line in such a manner that the provision of the read-out does not appreciably increase the size of the charge transfer line, and with respect to the memory application the facility for a true random accessing of the bits is desirable.

In our co-pending Patent Application No. 55563/72, which corresponds to U.S. application Ser. No. 419,435 there is described memory array in which random access is facilitated by the presence of a superimposed array of field effect transistors onto the basic structure of a surface channel CCD. However the reading of such a memory device gives rise to difficulties because the deep depletion field effect transistor structure source and drain regions associated with any one particular bit are not located in the immediate proximity of the memory bit and series resistance problems arise in connection with the read-out, it being necessary to pass a read-out current along the whole length of the CCD line in which the particular bit is present. Furthermore for satisfactory operation the memory is not a true binary system, it being necesary to have charge packets present of two different sizes to represent a 'zero' and a 'one'.

According to one aspect of the invention a semiconductor device comprises a semiconductor body having a semiconductor layer of one conductivity type, means for enabling the semiconductor layer to be locally fully depleted without avalanche multiplication in order to allow the movement of majority charge carriers representative of information via the interior of the layer to one or more storage sites in the layer, means for enabling the reading or information present at least in one storage site comprising an insulated gate field effect transistor having its channel region present at the surface of the semiconductor layer above said one storage site and between source and drain regions of the opposite conductivity type, and means for enabling the temporary confinement of the quantity of majority charge carriers in said one storage site to the interior of the layer without mixing of the stored charge carriers in said one storage site and the mobile charge carriers in the transistor channel in order that the current flow in the transistor channel when the transistor gate electrode is maintained at any given potential is dependent upon the quantity of charge in the said one storage site.

According to another aspect of the invention a semiconductor device comprises a semiconductor body having a semiconductor layer of one conductivity type, in which means are present to isolate the semiconductor layer from its surrounding and said layer has a thickness and doping concentration in which a depletion layer can be obtained throughout the thickness of the semiconductor layer by means of an electric field while avoiding breakdown, means for enabling the local introduction into the layer of electrical charge representative of information and in the form of majority charge carriers, means for enabling the reading of said charge in the layer, and an electrode system for the capacitive generation of electric fields in the semiconductor layer being present adjacent at least one side of the layer and by means of which the charge can be transported via the interior of the layer to the reading means and at least during the reading confined to the interior of the layer, said reading means comprising an insulated gate field effect transistor structure having source and drain regions formed by first and second regions of the opposite conductivity type adjoining the surface of the layer and a gate electrode overlying and insulated from the layer, the gate electrode forming part of the said electrode system for generation of electric fields, the first and second regions and the gate electrode defining a current carrying channel region of the transistor in a surface part of the layer to below which the charge to be read can be transported and confined without mixing of the charge carries thus transported and the mobile charge carriers in the transistor channel.

A device in accordance with the invention which may take various forms as will be described hereinafter, in so far as the non-destructive reading of information as represented by a charge packet present in the interior of a semiconductor layer is concerned differs from prior art devices by the provision of amplification means in the form of the said transistor within the layer in such manner that a high sensitivity of charge detection may be achieved with low noise. The device may be constructed with a relatively low input capacitance and in the amplification means which may be referred to generally as a 'floating surface amplifier' (FSA) the potential may be well defined in such manner that irregularities due to a floating electrode and indeterminate amounts of fixed charge thereon do not occur as in the prior art floating gate amplification (FGA) stages.

In one form the semiconductor device is a charge coupled device comprising at least one charge transfer line in which majority charge carriers can be transported between successive storage sites in the line via the interior of the semiconductor layer in a lateral direction parallel to two opposite major sides of the layer, at least one of the storage sites having associated therewith a said means for enabling the reading of charge in the layer and comprising an insulated gate field effect transistor structure. Such a device is shown, for example, in FIGS. 4–6.

The device in the said one form may be considered as a charge coupled device comprising a semiconductor body having a semiconductor layer of one conductivity type, means for enabling the semiconductor layer to be locally fully depleted without avalanche multiplication in order to allow the transfer of majority charge carriers representative of information between storage sites via the interior of the layer, one or more of the storage sites each having associated therewith separate means for enabling the reading of said information, each reading means comprising an insulating gate field effect structure having its channel region present at the surface of the semiconductor layer above the storage site and between source and drain regions of the opposite conductivity type, and means for enabling the quantity of majority charge carriers in the storage site to the interior of the layer without mixing of the stored charge carriers in the storage site and the mobile charge carriers in the transistor channel in order that the current flow in the transistor channel when the gate electrode is maintained at any given potential is dependant upon the quantity of charge in the said one storage site.

The provision of the reading means in such a form of charge coupled device, sometimes referred to as a bulk channel charge coupled device, enables the detection of charge with a significantly higher sensitivity and lower noise than is possible with the previously described prior art means. In particular the potentials involved are well defined and a low input capacitance is achieved due to the provision of the reading means in the signal charge transfer channel. Furthermore advantages arise in connection with the saving in area when providing the reading means in the charge transfer channel and the means whereby the transistor is thus situated may be relatively simple as will be described hereinafter.

In a charge coupled device in accordance with the invention at least one of the surface regions of the opposite conductivity type forming the source and drain of the transistor belonging to the reading means may be a region forming part of means for isolating the semiconductor layer from its surroundings. In this manner the reading means may be provided in various different forms in an advantageous manner as will be described hereinafter.

Thus in a device in which in a direction transverse to the direction of charge transport the semiconductor layer is at least partly laterally bounded along one side by a surface region of the opposite conductivity type, said region may form one of said regions constituting the source and drain of the transistor.

In some forms of this device the other of said regions of the opposite conductivity type is formed by an island surface region of the opposite conductivity type situated in and surrounded by the layer of the one conductivity type. See, for example, FIG. 6. The provision of the regions of the opposite conductivity type in this manner enables the transistor channel to be located conveniently within the part of the layer in which the signal charge transfer channel is present and also enable a simplification of the means whereby electrical contact is made to the transistor source and drain regions.

Figure 11:
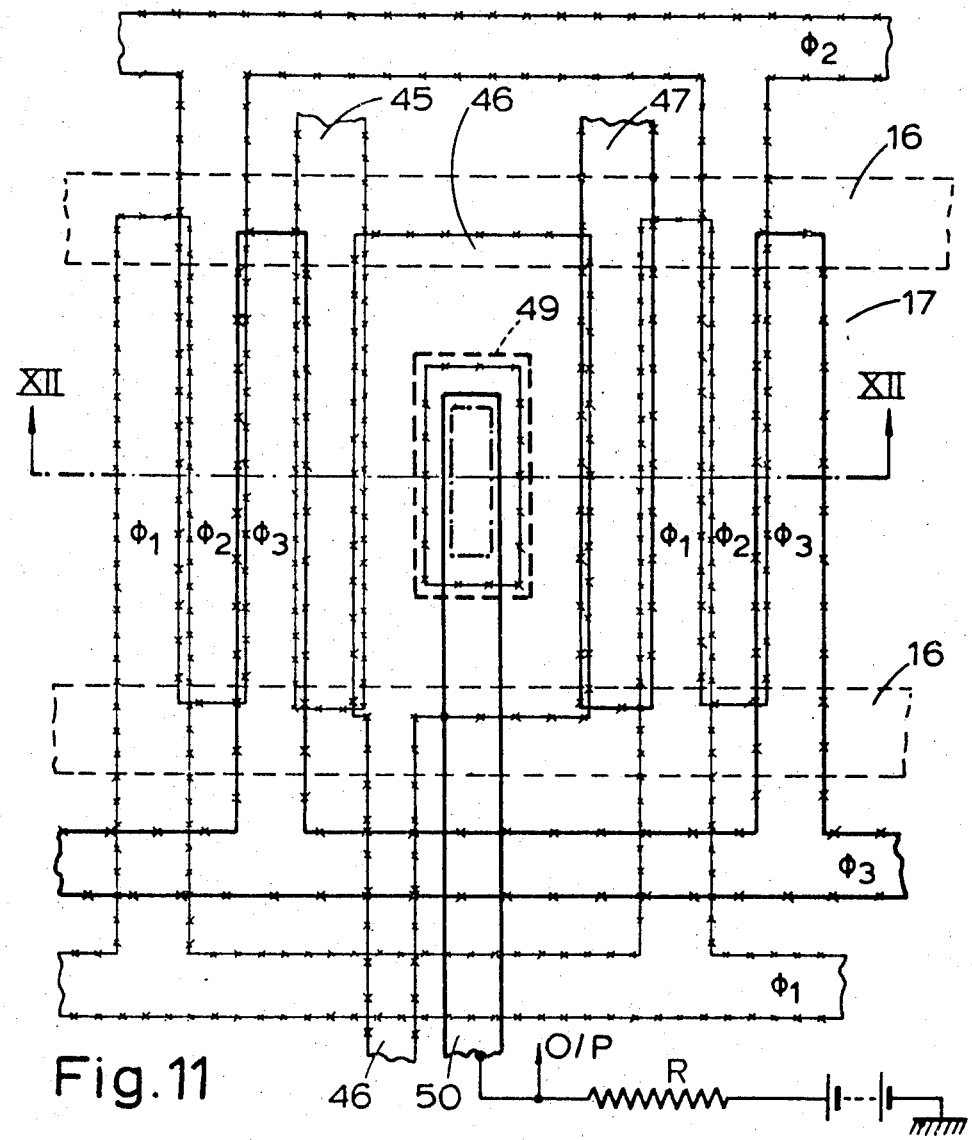
Figure 12:
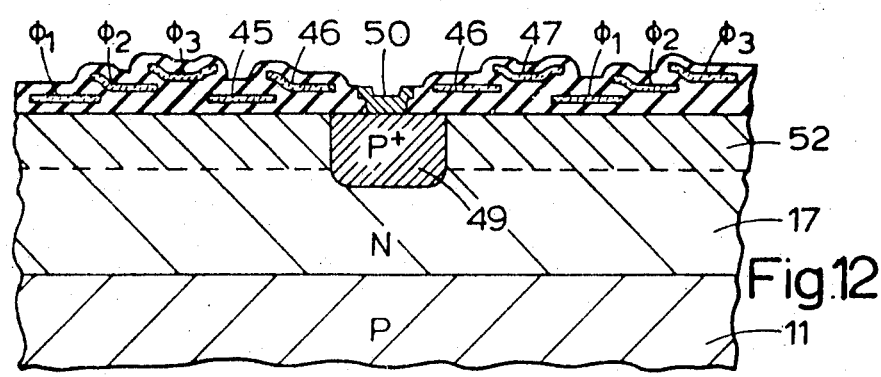

In one form of the said charge coupled device in which one of said regions of the opposite conductivity type constituting the source and drain of the transistor is formed by a surface region of the opposite conductivity type at least partly laterally bounding the semiconductor layer along one side and the other of said regions is formed by an island surface region of the opposite conductivity type, the transistor gate electrode extends across the entire width of the semiconductor layer and overlaps the entire periphery of the island surface region of the opposite conductivity type as shown, for example, in FIGS. 11 and 12. In this device the structure may be relatively simple. Furthermore the charge handling capacity of the device may be maintained at a high value if the semiconductor layer of the one conductivity type comprises a more highly doped surface portion extending throughout the layer. In this context reference is invited to co-pending Patent Application No. 11974/74 which corresponds to U.S. application Ser. No. 450,996 and which describes the provision of such a more highly doped surface portion in a charge coupled device in which the charge transport is via the interior of the semiconductor layer.

Figure 6:
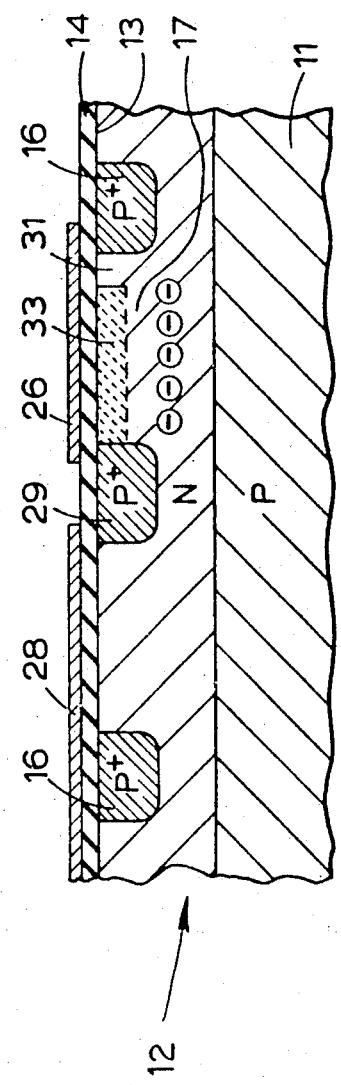

In another form of such a device in which one of said regions of the opposite conductivity type is formed by a surface region at least partly laterally bounding the semiconductor layer along one side and the other of said regions is an island surface region, the reading means transistor channel extends only across part of the width of the semiconductor layer, which part lies between the island surface region of the opposite conductivity type and the said surface region of the opposite conductivity type at least partly laterally bounding the semiconductor layer along one side, as shown, for example, in FIG. 6. In such a device it is normally desired to pass all the charge in any given charge packet under the reading means transistor channel and thus in preferred forms of such a configuration means are present for causing a diversion of the charge transported via the interior of the layer to the interior of that part of the layer comprising the transistor channel and situated between the island surface region of the opposite conductivity type and the said surface region of the opposite conductivity type at least partly laterally bounding the semiconductor layer along one side. Such a concentration of the charge packet will enable a high sensitivity to be obtained in the reading means but obviously this will be accompanied by a limitation of the charge handling capacity of the charge coupled device.

It is also necessary to simultaneously confine the majority charge carrier in a charge packet in the interior of the layer and the surface current in the reading means transistor channel to the same portion of the part of the layer which lies between the island surface region of the opposite conductivity type and the said surface region of the opposite conductivity type at least partly laterally bounding the semiconductor layer along the said one side.

Various structural features may be employed to obtain the charge diversion and charge and surface current confinement. In preferred forms said means comprise a locally formed more highly doped surface region of the one conductivity type in the said part of the layer which comprise the reading means transistor channel as in FIG. 6. This more highly doped surface region may be formed, for example, by ion implantation.

Figure 10:
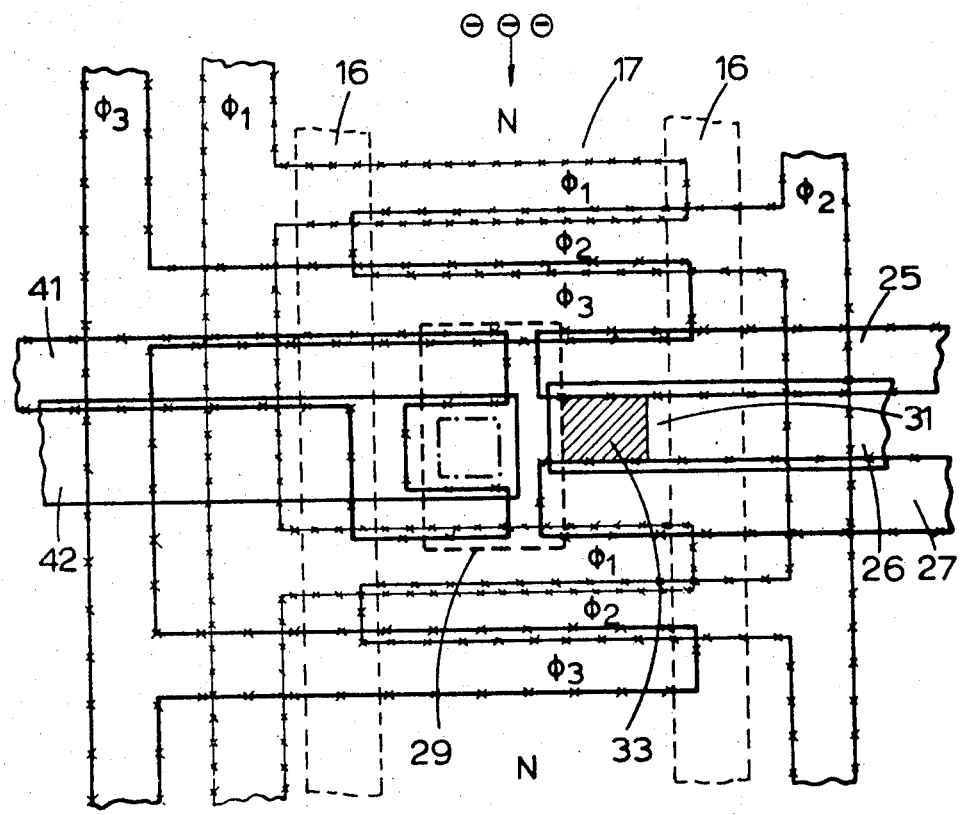

In one such preferred form said means also comprise a screening electrode present above and insulated from a part of the layer between the island surface region of the opposite conductivity type and the lateral boundary of the semiconductor layer along the side opposite said one side, as illustratively shown in FIG. 10. If said lateral boundary along the side opposite the said one side is also at least partly provided by a surface region of the opposite conductivity type it is then possible, when providing such a screening electrode, to operate the device with the two surface regions of opposite conductivity type at least partly laterally bounding the layer at the same potential, or for the two said surface regions to be present as one common surface region of the opposite conductivity type. In this manner the desired operation can be achieved, when the semiconductor layer is a relatively thin semiconductor layer of the one conductivity type present on an opposite conductivity type substrate, with no undesirable effects occurring should the common surface region, or the two separate surface regions of opposite conductivity type be shorted through to the substrate. This should be compared with an alternative form in which an island surface region of the opposite conductivity type is operated as the transistor drain and the semiconductor layer of one conductivity type present on a substrate of the opposite conductivity type is laterally bounded along opposite sides by separate surface regions of the opposite conductivity type extending in but not through the layer of the one conductivity type of which two surface regions one is operated as the source, the reading means transistor gate electrode extending across at least substantially the whole width of the layer of the one conductivity type, and a locally formed more highly doped surface region of the said layer between the said source and drain constitutes the means for charge diversion and simultaneous charge and surface current confinement. Such a configuration is shown, for example, in FIG. 13. This form requires different voltages on the said two separate surface regions and thus has limitations in respect of the minimum possible thickness of the layer that may be used without risk of the shorting to the substrate.

When using a structure of the said one preferred form in which the said means for charge diversion and simultaneous charge and surface current confinement comprise a more highly doped surface region of the one conductivity type and a screening electrode it is possible to construct a device for operation with the island surface region as the transistor source and the surface region of the opposite conductivity type at least partly laterally bounding the semiconductor layer along said one side as the drain or alternatively with these regions respectively forming the transistor drain and transistor source. In order to avoid the presence of a p-n junction having a low breakdown voltage the said locally formed more highly doped region of the one conductivity type may not extend completely across the width of the layer part in which the transistor channel is present. Thus for a structure in which the more highly doped surface region extends in contact with the island surface region of the opposite conductivity type but in order to avoid such a low breakdown voltage junction is spaced from the opposite conductivity type region at least partly laterally bounding the layer along the said one side the device will be operated with the island surface region as the source. To utilize this feature in a device in which the island surface region is to be used as the drain then the more highly doped surface region will be spaced from the island surface region but extend in contact with the said opposite conductivity type region at least partly laterally bounding the layer along the said one side.

As an alternative to the use of a more highly doped surface region in the said means for charge diversion and simultaneous charge and surface current confinement there may be employed a locally present part of the semiconductor layer of increased thickness.

In another form of the charge coupled device in a direction transverse to the direction of charge transport the semiconductor layer is laterally bounded along opposite sides by a pair of surface regions of the opposite conductivity type which constitute the said regions forming the source and drain of the transistor, the gate electrode extending across the entire width of the semiconductor layer between said surface regions and means being present for producing a simultaneous confinement of the stored charge carriers in the interior of the semiconductor layer and the transistor surface current to a part of the layer below the gate electrode, for example a more highly doped surface region of the one conductivity type or a thicker region of the one conductivity type, in the said part of the layer below the gate electrode. See, for example, FIG. 20. This structure is simple to realize with the layer provided on an opposite conductivity type substrate but must be operated with different potentials on the two surface regions of the opposite conductivity type and thus limiting the minimum thickness of the layer of the one conductivity type that may be used without the said surface regions shorting to the substrate. Furthermore, the surface regions of the opposite conductivity at least partly bounding the semiconductor layer will usually be of a fairly large area and therefore receive a fairly large current caused by the thermal generation of charge carriers. This current will have associated noise and thus reduce the signal to noise ratio of the reading means transistor.

In yet another form both of said regions of the opposite conductivity type forming the transistor source and drain regions are located entirely within the layer of the one conductivity type, means being present for causing a diversion of the charge transported via the interior of the layer to the interior of the part of the layer situated between said regions and also the simultaneous confinement of the transistor surface current and the stored charge carriers in the interior of the layer to the same portion of said part of the layer between said regions. Said means may comprise a more highly doped surface region or thicker part of the layer and at least one screening electrode.

When the device in accordance with the invention is of the said one form and constitutes a charge coupled device the structure may be such that the insulated gate field effect transistor read-out means are present at each of a plurality of successively situated charge storage and transfer bits of the charge transfer line. In this manner it is possible to provide a compact charge coupled device having bulk transport with the facility of non-destructively reading charge packets in situ at the successively situated storage and transfer bits. Such a device may be in various different forms. It may be, for example, a device for signal processing applications, a display device, a memory device, an image recording device, or an image intensifier device. In one form it comprises at least one individual charge transfer line having an individually associated group of electrodes to which voltages can be applied for effecting the charge transfer. When such a device comprises a single line it may be constructed for operation as a tapped delay line. Another possibility is the use of linear array of the reading means along one line with additive outputs provided along an auxiliary line.

In another form the device comprises a plurality of parallel situated charge transfer lines with groups of electrodes to which voltages can be applied for effecting the charge transfer commonly associated with plural charge transfer lines. See, for example, FIGS. 21 and 22.

The charge storage and transfer bits in the plurality of lines may comprise an array of memory cells, for example for the operation in a digital mode, in which for each memory cell an individually associated read-out insulating gate field effect transistor structure is present, means being present for the random access of the information in the memory cells via the said read-out insulated gate field effect transistor structures.

In such a device comprising an array of memory cells, associated with the portion of the semiconductor layer in which a memory cell and associated transistor are present there may be means for controlling the potential distribution both at the surface of the layer and in the interior of the layer for obtaining confinement of a charge packet of majority carriers in the interior of the layer below and in registration with a first surface part overlaid by the transistor gate electrode and in which the transistor channel current flows and for inhibiting, by increasing the threshold voltage, transistor current flow in a second surface part overlaid by the transistor gate electrode.

In another form of the charge coupled device comprising the insulated gate field effect transistor read-out means at each of a plurality of successively situated charge storage and transfer bits of the charge transfer line, the device is an image display device means being associated with the layer for converting video input signals into a charge pattern which can be transferred in the form of majority charge carriers via the interior of the layer to the charge storage and transfer bits having individually associated insulated gate field effect transistor structures, display means being provided in series with the main current paths of said transistors for providing an output representative of the amount of charge present at the respective storage site. See, for example, FIGS. 23 and 24.

In some forms of a charge coupled device in accordance with the invention, an electrode system provided for the capacitive generation of electric fields in the semiconductor layer in order to effect the charge transfer comprises a group of electrodes separately associated with the charge reading means and to which group the gate electrode of the read-out insulated gate field effect transistor structure belongs. See FIG. 18. In preferred forms means are present for associating said group of electrodes with a first source of clock voltages and for associating preceding electrodes provided for the charge transfer with a second source of clock voltages. In this manner it is possible to control the period during which a charge packet is present below the transistor gate electrode of the reading means independently of the timing of the said second source of clock voltages and thus obtain a relatively longer dwell time of the charge packet below the gate electrode, for example two to three times the period of the storage time in any of the preceding storage sites below the electrodes associated with said second source of clock voltages.

The group of electrodes associated with the charge reading means may consist of three electrodes of which in the direction of charge transport the gate electrode is situated between the other two electrodes. In a preferred form of operation the gate electrode is maintained at a reference potential and the potentials of said other two electrodes varied by the said first source of clock voltages. Hereinafter in devices comprising such a group of three electrodes, for the sake of convenience of description the said two electrodes on opposite sides of the transistor gate electrode will be referred to as the input electrode and the output electrode associated with the charge reading means. The said preferred form of operation in which the gate electrode is maintained at a reference potential and clock voltages applied to the input and output electrodes is sometimes referred to as two-and-a-half phase clocking.

In the direction of charge transport following the last electrode of said group of electrodes separately associated with the reading means there may be present charge draining means. In this form the reading means are provided at the end of a signal charge transfer channel and the charge draining means may comprise an ohmic connection to the semiconductor layer of the one conductivity type.

Alternatively, in the direction of charge transport following the last electrode of said group of electrodes separately associated with the reading means a further electrode system may be present for the further transfer of the charge to a third part of the layer via the interior of the layer. In this form the reading means may thus be present at an intermediate location within a signal charge transfer channel. The structure of the reading means enables such an intermediate location to be readily obtained without any substantial increase in area because the read-out transistor channel effectively is present within the same part of the semiconductor body in which the signal charge transfer channel is present.

For the operation of the charge coupled device in so far as the charge transfer is concerned various different structures and operational means may be employed, for example the device may be constructed for such operation with two-phase, three-phase or four-phase clock voltages. In one preferred form comprising a group of electrodes separately associated with the reading means means are present for connecting the electrodes preceding the group of electrodes associated with the reading means, and where appropriate the electrodes following the group of electrodes associated with the reading means, to a three-phase source of clock voltages. The use of three-phase clock voltages and the appropriate provision of the clocking electrodes may be advantageous in a charge coupled device in accordance with the invention, particularly one in which the reading means are present at an intermediate location along a charge transfer line, because it is readily possible to achieve the desired synchronization between the clock voltages when the said first and second sources of clock voltages are employed. Also the various interconnections in the structure are relatively simple and in one form if it is sufficient that the charge dwell under the gate electrode is the same as under a clocking electrode the input and output electrodes associated with the reading means can be connected to or form part of the main system of clocking electrodes.

Furthermore in such a preferred form the said preceding electrodes may be arranged in groups of three and in each group the three electrodes may be of polycrystalline silicon spaced from the surface of the semiconductor layer by insulating layer parts of different thickness.

Figure 16:
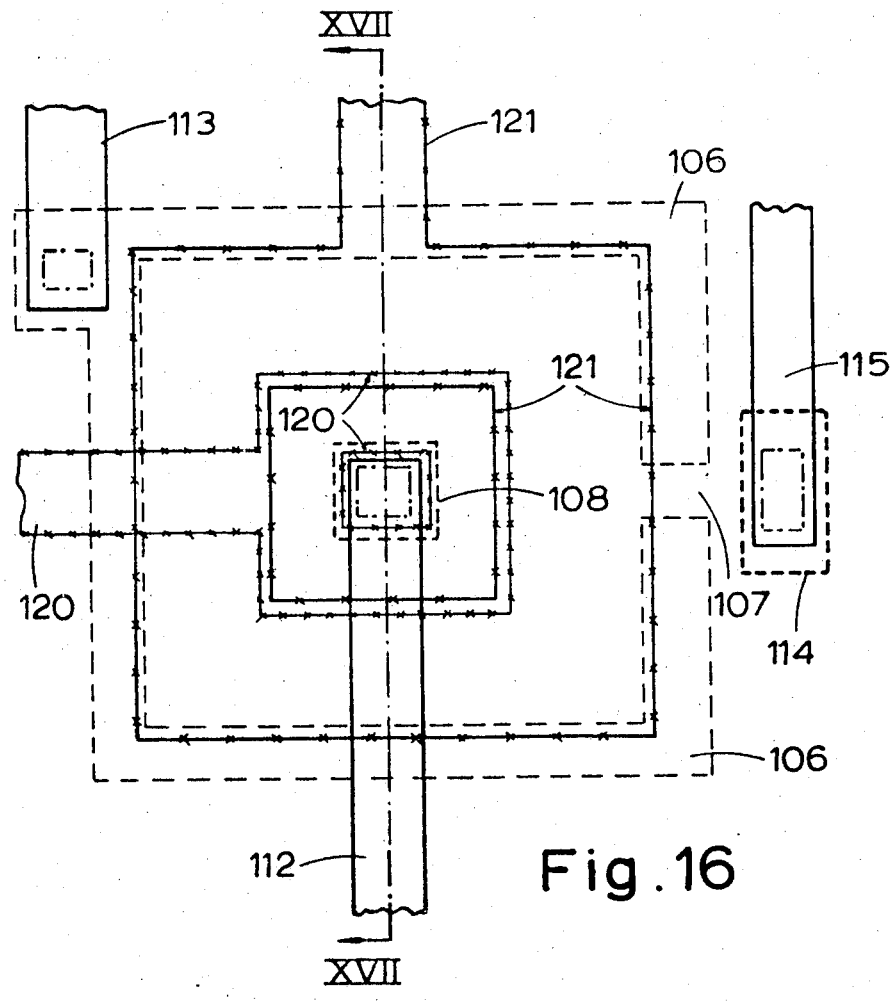
Figure 17:
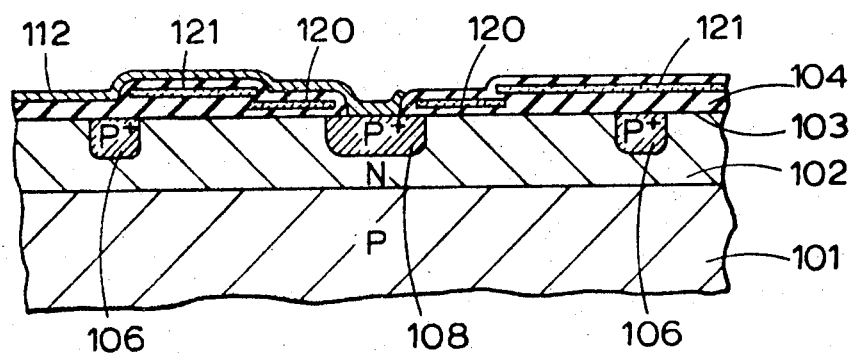

A semiconductor device in accordance with the invention may be other than a charge coupled device, for example the device may comprise one or more photo-detector elements such as shown, for example, in FIGS. 16 and 17. In one form of such a device comprising at least one photo-detector element the first region of the opposite conductivity type is laterally bounded in the layer of the one conductivity type by the second region of the opposite conductivity type, means being present for enabling radiation to be absorbed in a depletion region when formed extending at least throughout the thickness of the layer in the part thereof between said first and second regions of the opposite conductivity type, the electrode system comprising at least two electrodes situated above said part of the layer and together forming separated parts of the transistor gate electrode, majority charge carrier draining means being present for enabling the removal of radiation generated free majority charge carriers from the said part of the layer after their collection and storage in the interior of the layer below one of the electrodes belonging to the said electrode system. In a preferred form said majority charge carrier draining means comprise an opening in the second region of the opposite conductivity type which forms a narrow channel of the one conductivity type in the layer between the said part thereof between the first and second regions of the opposite conductivity type and a further part of the layer situated beyond the second region of the opposite conductivity type, and a conductive connection to said further part of the layer. In such a device there can be obtained a high sensitivity of detection of the stored charge which is representative of the incident radiation on the or each photo-detector element provided in the semiconductor body. Other structures are possible for the photo-detector element, for example structures in which the first and second regions of the opposite conductivity type both consist of island surface regions of the opposite conductivity type situated in a part of the layer of the one conductivity type laterally bounded by a region, for example of the opposite conductivity type, which is used for at least partly isolating said part of the layer from its surroundings.

Figure 2:
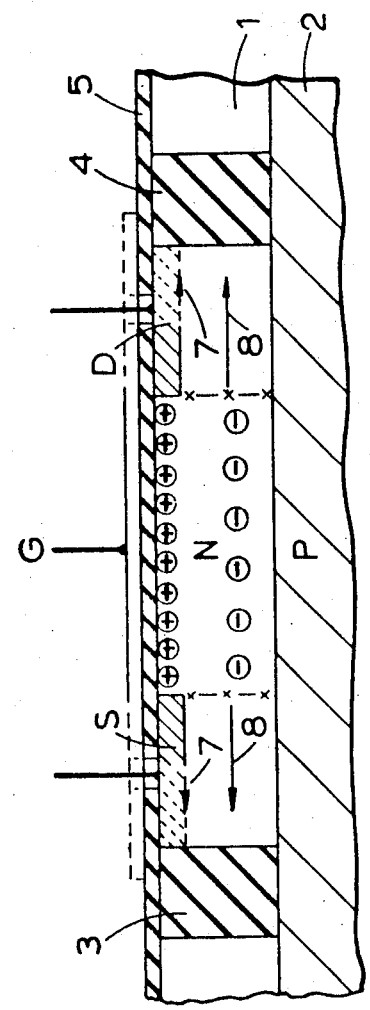
Figure 3:
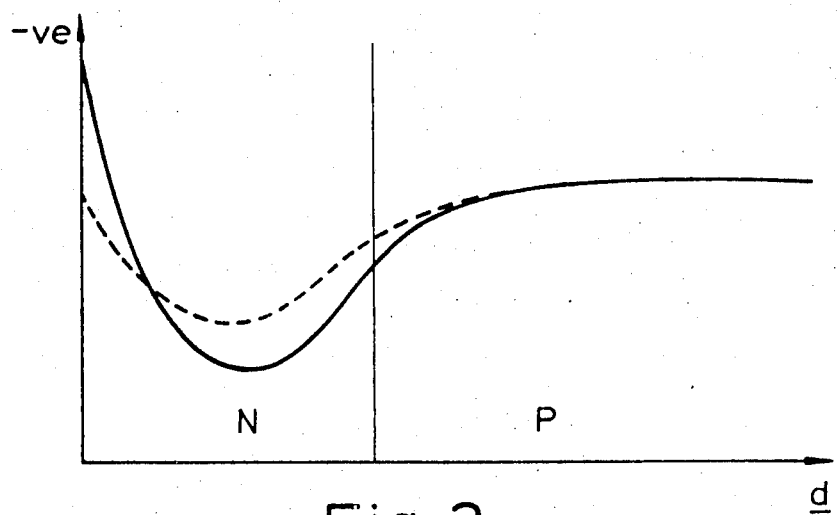
Figure 7:
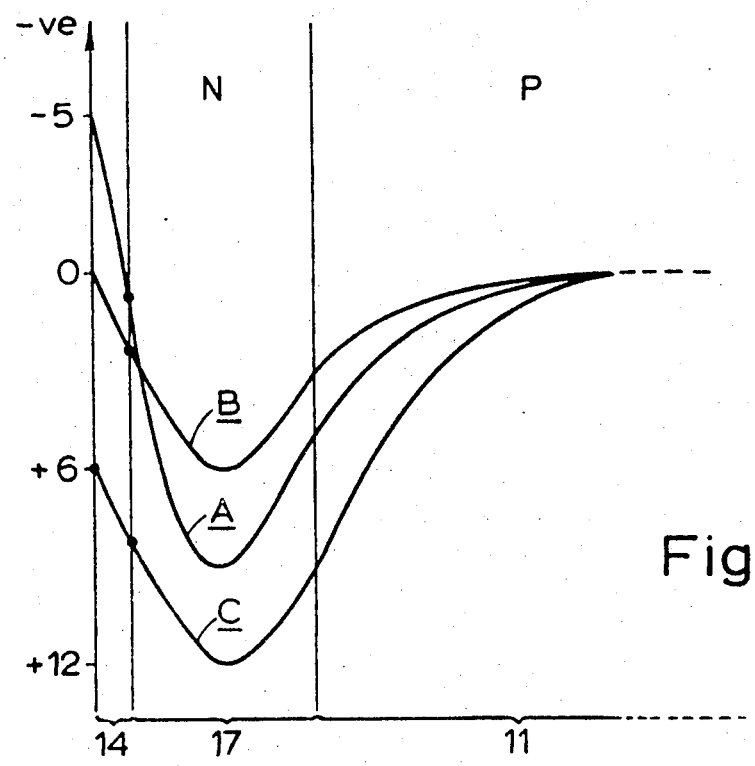
Figure 4:
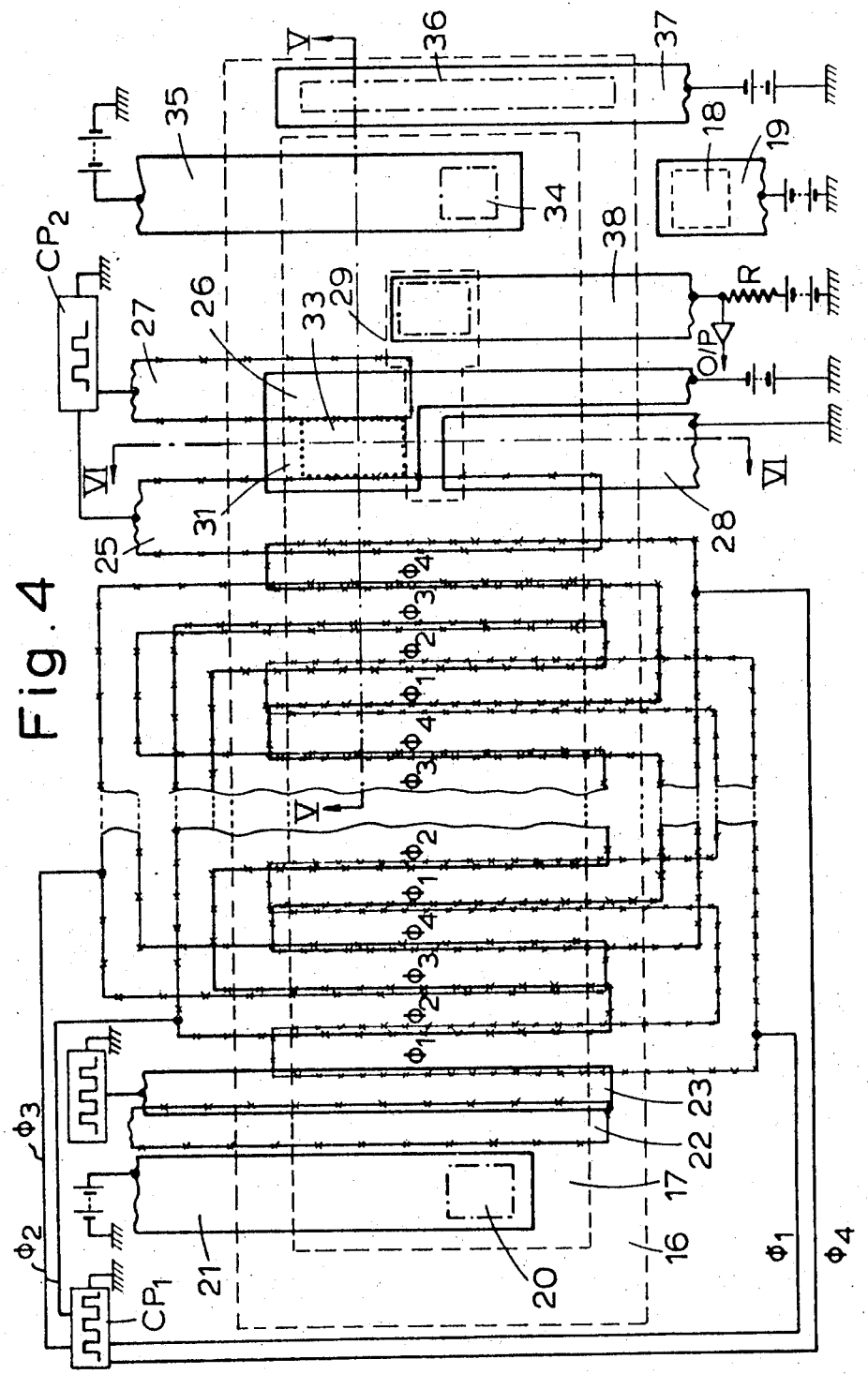
Figure 5:
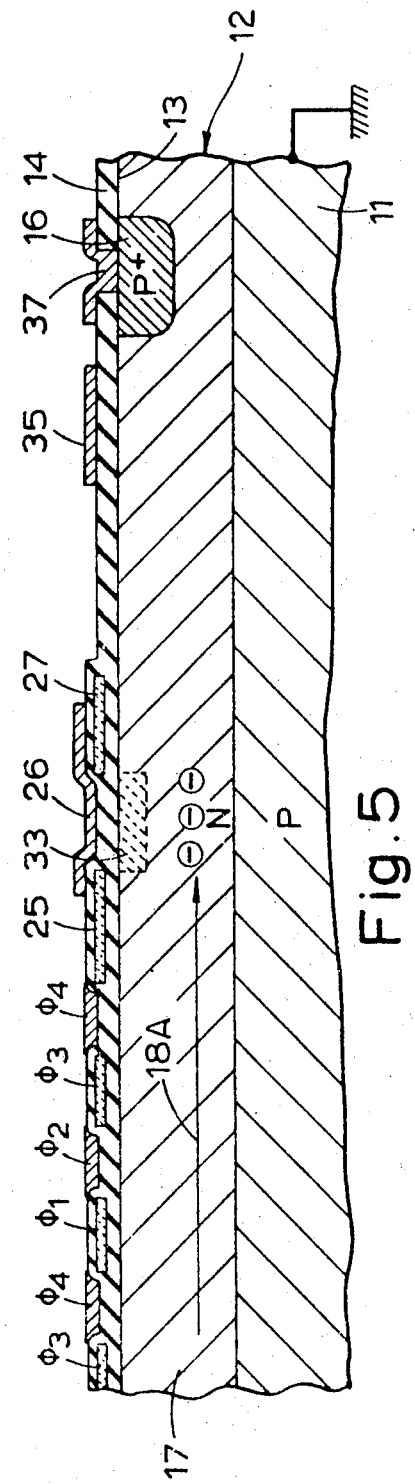
Figure 8:
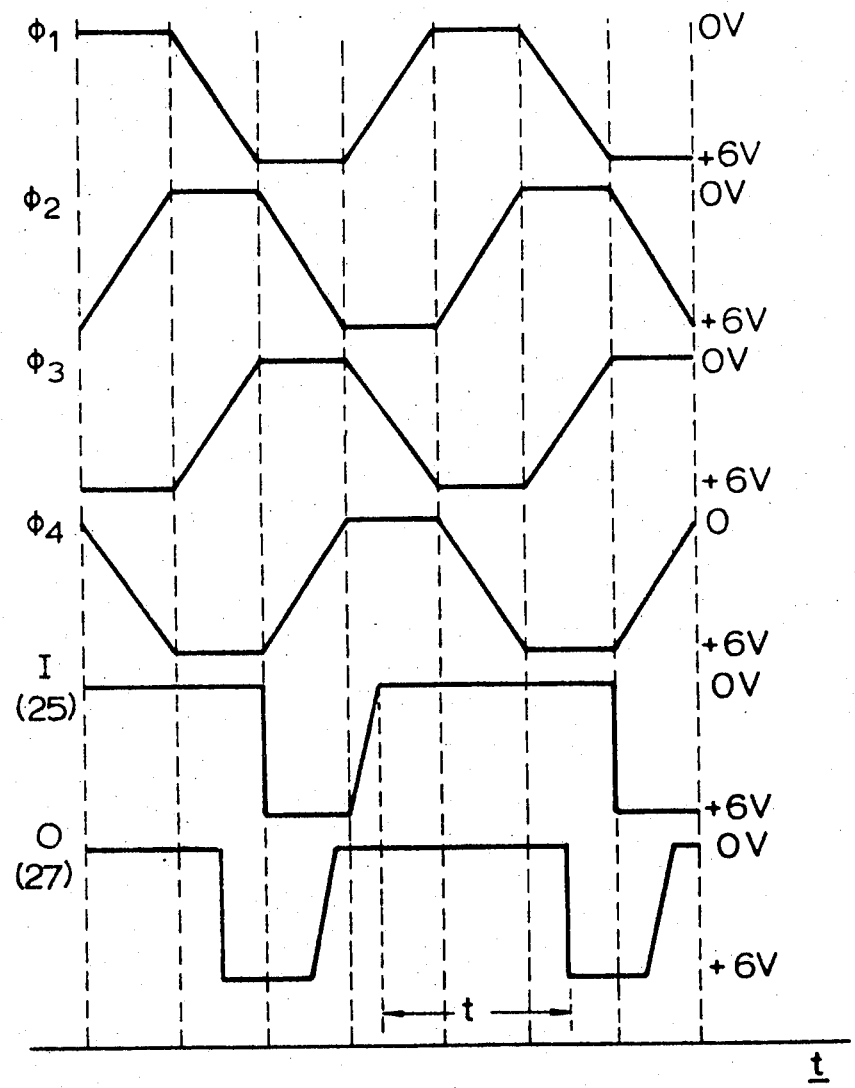
Figure 18:
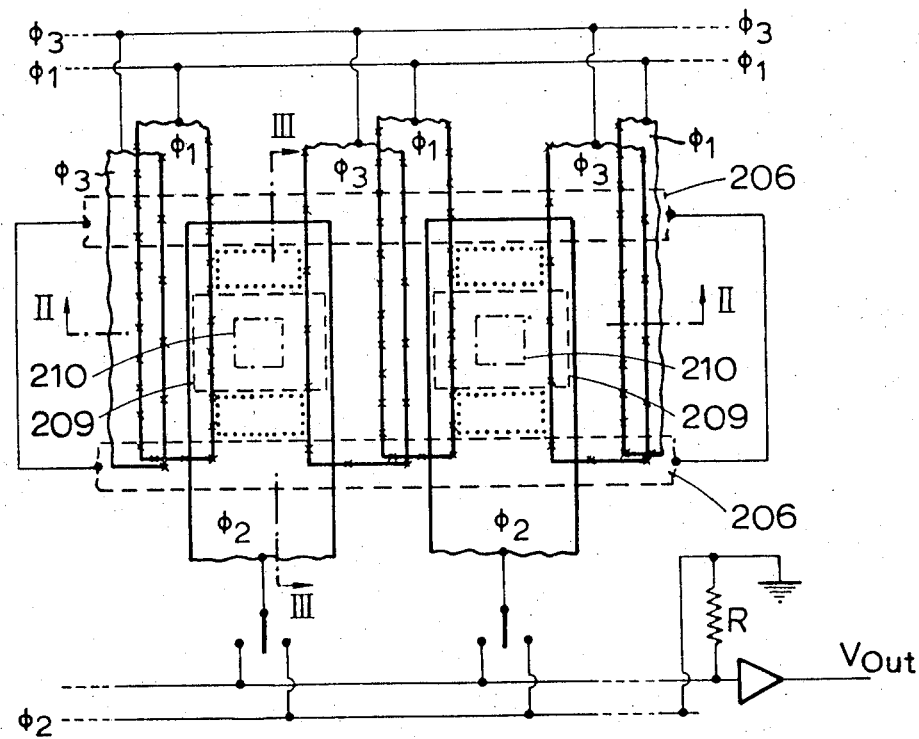
Figure 19:
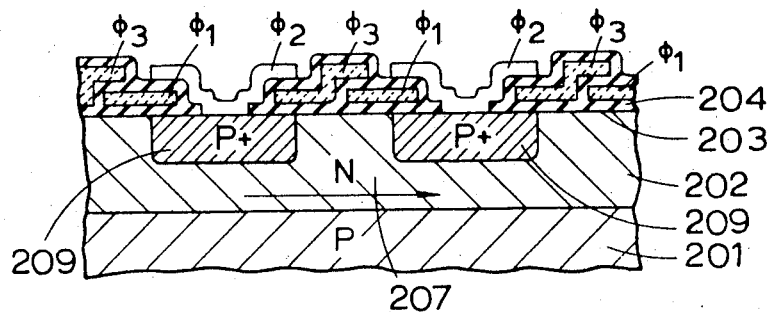
Figure 20:
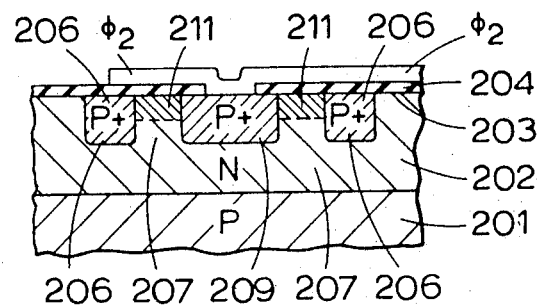
Figure 21:
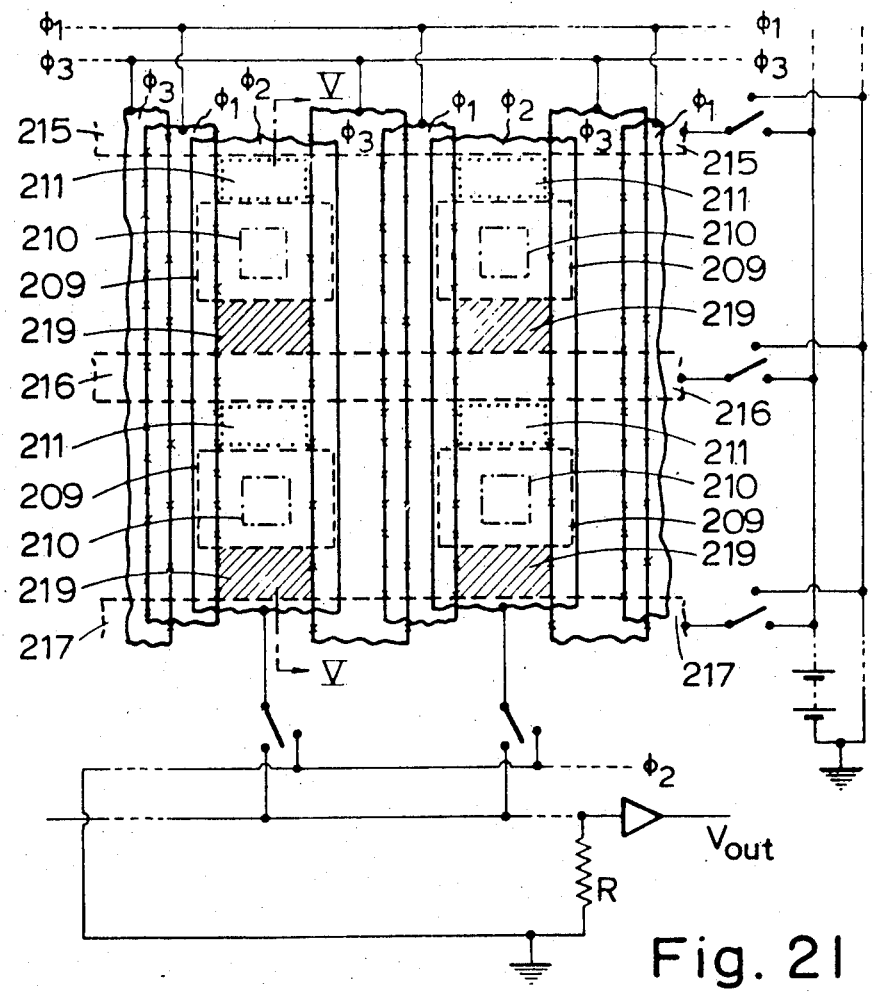
Figure 22:
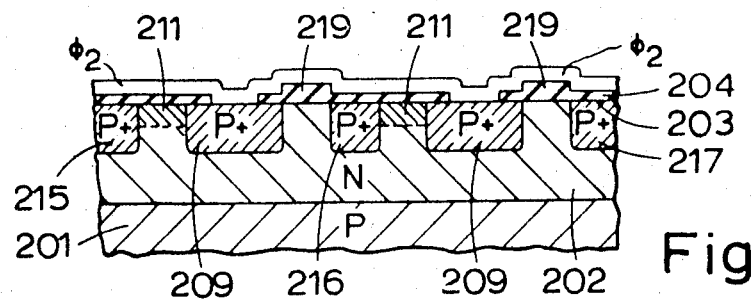
Figure 23:
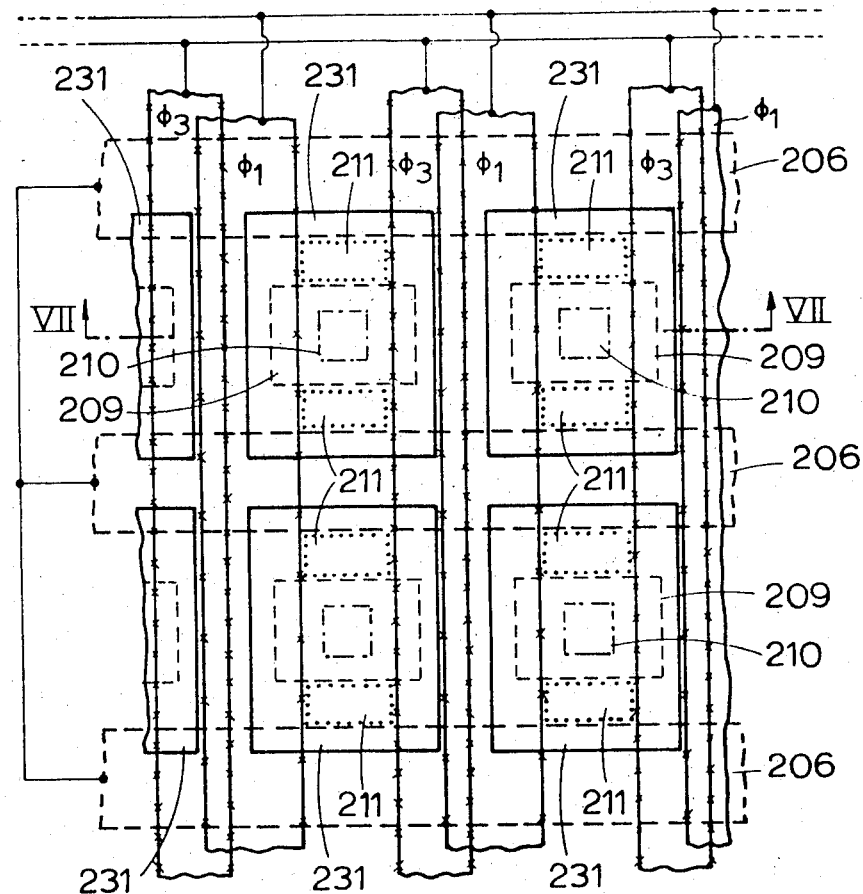
Figure 24:
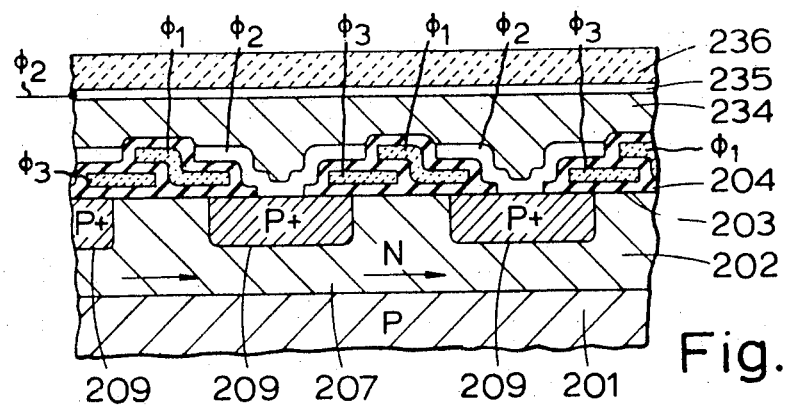

Embodiments of the invention will now be described, by way of example, with reference to the accompanying diagrammatic drawings, in which:

FIGS. 1 and 2 respectively are schematic plan and sectional representations for the purpose of illustration of the underlying structural and operational principles of a semiconductor device in accordance with the invention, and FIG. 3 is a schematic representation of the potential distribution in a part of such a device, FIG. 4 is a plan view of part of a first embodiment of a semiconductor device in accordance with the invention and consisting of a charge coupled device, the Figure also showing in schematic form the circuit connection of the device, FIGS. 5 and 6 are cross-sectional views taken along the line V-V and VI-VI respectively of FIG. 4, FIG. 7 is a graph showing the potential distribution in different parts of the device shown in FIGS. 4 to 6 during different times during the operation of the device, FIG. 8 shows the waveforms of the various clock voltages applied to electrodes of the device shown in FIGS. 4 to 7, FIG. 9 shows in cross-sectional view part of another embodiment, this device consisting of a charge coupled device suitable for imaging purposes and apart from the means whereby the charge is introduced into the semiconductor layer havng a structure and operational means consisting essentially the same as the device shown in FIGS. 4 to 6, FIG. 10 shows in plan view part of a further embodiment in the form of a charge coupled device in which charge reading means are present at an intermediate location in a signal charge transfer channel, FIG. 11 shows in plan view part of another embodiment in the form of a charge coupled device, this embodiment having a structure to yield a relatively high charge handling capacity, FIG. 12 is a cross-section taken along the line XII—XII of FIG. 11, and FIGS. 13, 14 and 15 are plan views of parts of further embodiments, each consisting of a charge coupled device, FIGS. 16 and 17 are a plan view and cross-section respectively of part of another semiconductor device in accordance with the invention and consisting of a photo-detector, FIG. 18 is a plan view of a part of a charge coupled device in accordance with the invention and suitable for adaptation as a tapped delay line, FIGS. 19 and 20 are cross-sectional views taken along the lines II—II and III—III respectively of FIG. 18;

FIG. 21 is a plan view of part of another charge coupled device in accordance with the invention and forming a random access memory, FIG. 22 is a cross-sectional view taken along the lines V—V of FIG. 21, FIG. 23 is a plan view of another charge coupled device in accordance with the invention and forming an image display device, and FIG. 24 is a cross-sectional view taken along the line VII—VII of FIG. 23.

Referring first to FIGS. 1 to 3 there will be described in broad outline the underlying structural and operational principles of a device in accordance with the invention. For the sake of convenience of illustration the device to be described is a charge coupled device of the kind in which the transport of charge via storage sites in a semiconductor layer is via the interior of the semiconductor layer. However as will be described hereinafter, within the scope of the invention there are other device structures, for example photo-detector device structures comprising one or more photo-detector elements in which a charge packet representative of information can be transferred to and temporarily confined in a storage site within the interior of a semiconductor layer and an output representative of the charge packet can be derived from means present at the surface of the or each part of the layer which includes the or each such storage site.

The schematic plan and section views of FIGS. 1 and 2 show part of a channel charge coupled device in which electrical charge representative of information is transported between storage sites in a semiconductor layer via the interior of the semiconductor layer.

The device comprises a semiconductor layer 1 of one conductivity type present on a substrate 2, for example an insulating substrate or an opposite conductivity type substrate. The layer 1 is laterally bounded along opposite lateral edges by regions 3 and 4. The regions 3 and 4 which serve for laterally bounding and partly for isolating the layer from its surrounding may consist, for example, of insulating material. Alternatively the regions 3 and 4 may be formed, for example, by regions of the opposite conductivity type which extend at least partly across the thickness of the semiconductor layer 1 from the surface thereof towards the substrate 2. In the case when the said opposite conductivity type regions extend only partly across the thickness of the layer the isolation of the layer 1 in operation is completed by depletion zones extending between the regions 3, 4 and the substrate. The semiconductor layer 1 has such a thickness and doping that the layer may be fully depleted without avalanche multiplication. On the surface of the layer 1 there is an electrode system comprising a plurality of groups of serially arranged electrodes $\phi_1$, $\phi_2$ and $\phi_3$ of which the electrodes $\phi_x$, where $x$ is 1, 2, or 3, in different groups are interconnected and serve for receiving three-phase clock voltages. These electrodes $\phi_1$, $\phi_2$ and $\phi_3$ extend across the entire width of the semiconductor layer. By application of clock voltages of suitable magnitude charge in the form of majority charge carriers can be transferred sequentially between storage sites associated with the electrodes via the interior of the semiconductor layer. For a full description of the means of operation to obtain the charge transfer reference is invited to co-pending Patent Application No. 48980/72 which corresponds to U.S. application Ser. No. 299,748. The charge to be transported can be initially introduced into the layer via various means dependant upon the particular application of the device. Thus in one form the device is constructed for an imaging application and the majority charge carriers are separated by the electric field present after being generated as electron-hole pairs by the absorption of incident radiation. In another form the device is constructed for a signal processing application, for example a delay line and the majority charge carriers are injected into the semiconductor layer at one end of the layer adjacent the first group of electrodes $\phi_1$, $\phi_2$, $\phi_3$. As in a device in accordance with the invention consisting of a charge coupled device the particular form of the charge input means is $\phi_1$, $\phi_2$, $\phi_3$. As in a device in accordance with the invention consisting of a charge coupled device the particular form of the charge input means is not an essential feature of the device the said input means are not shown in FIG. 1. In FIG. 1 the direction of charge transport is indicated by the arrow 6. Situated on the insulating layer 5 immediately above the last group of electrodes $\phi_1$, $\phi_2$, $\phi_3$ there is a further group consisting of three further electrodes I, G and O. These electrodes also serve for receiving clock voltages but preferably, although not essentially, from a different source of clock voltages than is used for supplying clock voltages to the electrodes $\phi_1$, $\phi_2$, $\phi_3$. The group of electrodes I, G, and O are associated with charge reading means, which are only shown schematically, comprising an insulated gate field effect transistor structure having source and drain regions formed by surface regions of the opposite conductivity type indicated by references S and D in FIG. 1 and a gate electrode formed by the electrode G. The lateral extent of the gate electrode G beyond the source and drain regions is indicated in broken lines because in a practical embodiment the electrode structure will be more complex and depending upon the location and form of the source and drain regions further electrode means may be present. Similarly in FIG. 2 the lateral extent of the opposite conductivity type regions S and D forming the transistor source and drain are indicated in broken lines as in a practical embodiment the location and form of these regions with respect to the regions 3 and 4 may take various different forms and may be more complex than would appear from FIG. 2. The arrows 7 indicate that these regions S and D may be thus differently located. Furthermore in some forms a more highly doped surface region of the one conductivity type may be present at least locally in the part of the layer of the one conductivity type between the opposite conductivity type regions S and D. Nevertheless the Figures enable an illustrative description to be made of the operational principle of the charge coupled device. For the purpose of description of the operation it will be assumed that the layer 1 is an n-type layer and the regions S and D are p-type regions. Majority charge carriers in the layer 1, that is electrons, are transported via the interior of the layer between successive storage sites associated with the electrodes $\phi_1$, $\phi_2$, $\phi_3$ by application of suitable three-phase clock voltages to said electrodes.

Consider now the case when a certain charge packet of electrons is transported via the interior of the layer to a storage site below the last electrode $\phi_3$ immediately preceding the input electrode I of the reading means. The clock voltages applied to the various electrodes when the said charge packet is stored below the last electrode $\phi_3$ will be such that the n-type layer 1 will be fully depleted under the preceding two electrodes $\phi_1$, $\phi_2$ and also under the following two electrodes I and G of the read-out means. On reaching the next phase of the clock voltages supplied to the various electrodes the charge packet will be transferred to below the input electrode I and any charge packet previously present below the output electrode O will be transported in some embodiments via charge draining means (not shown) or in the other embodiments to the next stage of the device indicated diagrammatically in FIG. 1 by the electrodes $\phi_1'$, $\phi_2'$ and $\phi_3'$ in broken lines. Thus when the charge packet is stored in a storage site below the input electrode I the n-type layer 1 will be fully depeleted under the preceding electrodes $\phi_2$ and $\phi_3$ and also under the following two electrodes G and O of the read-out means. On reaching the next phase of the clock voltages supplied to the various electrodes the charge packet will be transported via the interior of the layer 1 to below the gate electrode G and stored below said gate electrode G with the n-type layer below the input and output electrodes I and O on opposite sides of the gate electrode fully depleted during the period when the charge packet is stored below the gate electrode G. By arranging the potential distribution in the n-type layer 1 during this period of storage under the gate electrode G such that the interior of the layer is more positive than the corresponding parts of the layer below the adjacent electrodes I and O and the surface of the layer under the gate electrode G is more negative than under the adjacent electrodes I and O it is possible to simultaneously confine the stored charge packet of electrons or majority carriers to the interior of the layer below the gate electrode G and the current flow of holes or minority carriers to the vicinity of the surface below the gate electrode G in such manner that the current flow of holes at the surface of the layer in the transistor channel between the source and drain regions S and D when the transistor is operated during said storage period with any given potential on the gate electrode is dependent upon the magnitude of the charge packet of electrons stored in the interior of the layer, this occurring without mixing between the electrons in the charge packet confined to the interior of the layer and the mobile holes in the transistor channel in the vicinity of the surface. FIG. 2 diagrammatically shows the electrons in the charge packet in the interior of the layer separated from the holes in the transistor channel at the surface of the layer. FIG. 3 diagrammatically shows the potential under the gate electrode G in a full line and under the input and output electrodes I and O in a broken line as a function of the depth $d$ from the surface of the n-type layer 1. The various means whereby the said potential distribution can be obtained will be described hereinafter with reference to the various embodiments. However the means whereby read-out of the charge packet is effected will now be described. The clock voltage producing means associated with the read-out stage comprising the gate electrode G and the input and output electrodes I and O preferably is such that a constant voltage is applied to the gate electrode G throughout the clocking and the electrodes I and O are clocked between two different levels. The gate electrode may be biased with respect to the source to produce any desired standing current to optimise the signal to noise ratio.

When operating the transistor with a fixed potential applied to the gate electrode G the transfer, via the clocking of the various electrodes, of a charge packet of electrons to the storage site in the interior of the layer below the gate electrode G will have the effect that because the surface potential below the gate is clamped substantially at the source potential it cannot be made more negative by the influence of the charge packet of electrons and therefore more holes will move into the transistor channel from the source to balance the number of electrons in the charge packet with a consequent increase in the source to drain current. Thus the transistor source to drain current will increase proportionally with the quantity of charge in the charge packet transferred to the storage site below the gate electrode G. In this manner a sensitive low noise charge amplification stage can be produced within the signal charge transfer channel of a buried channel charge coupled device.

In FIG. 2 the confinement of the charge packet of electrons below the gate electrode G is diagrammatically indicated by chain lines and the arrows 8 indicate that as the location of the area of the transistor channel is determined in different configurations so also is the area of the confinement of the charge packet. Although the charge coupled device described is one constructed for operation with three-phase clock voltages applied to the main clocking electrodes to effect the charge transport via the interior of the layer to the read-out means the invention is not restricted to such three-phase devices and for example, the novel read-out stage can be used with devices constructed for operation with two-phase or four-phase clock voltages applied to the main clocking electrodes.

A first embodiment of a device in accordance with the invention will now be described with reference to FIGS. 4 to 8 of the accompanying drawings. This device is a charge coupled device of the form in which the charge is transported via the interior of a semiconductor layer and in the form shown for the purpose of illustration the input of charge representative of information is shown as being via electrical means. However in a charge coupled device in accordance with the invention the input of charge representative of information may alternatively be by optical means and the device appropriately structured, for example as an image pick-up device. It is in the latter class of devices, particularly for low light level imaging, that the novel read-out means of the device structure find particularly important application at the present time. Nevertheless, as previously described, the novel read-out means of the device structure does also have application in signal processing charge coupled devices.

In the device structure shown in FIGS. 4 to 6 there is a p-type silicon substrate 11 of 30 ohm. cm. resistivity and 200 microns thickness having thereon an n-type silicon epitaxial layer 12 of 8 ohm. cm. resistivity and 4 microns thickness. On the upper surface 13 of the epitaxial layer 12 there is an insulating layer 14 of silicon oxide. A $p^+$-diffused region 16 is present at the surface of the n-type epitaxial layer and in operation serves in part to define the lateral boundary of a portion 17 of the n-type epitaxial layer within which a signal charge transfer is present. Thus parallel to the direction of charge transport as indicated by the arrow 18A the signal charge transfer channel is laterally bounded along opposite edges by the $p^+$-region 16. In operation the portion 17 of the n-type layer is isolated from its surroundings, with the exception of the means for introducing and withdrawing charge from this portion of the layer as will be described hereinafter, by reverse biasing the p-n junction between the p-type substrate 11 and the n-type layer 12 and by reverse biasing the p-n junction between the $p^+$-region 16 and the n-type layer 12. Beyond the $p^+$-region 16 there is an $n^+$-contact region 18 having a connection conductor 19 applied thereto. For the sake of convenience of illustration the n-type region 18 is shown as a locally present surface region outside the $p^+$-region 16 but in practice such an $n^+$-region will be provided extending substantially all the way round the $p^+$-region and separated therefrom. The purpose of the $n^+$-region is to closely define the potential of all parts of the n-type layer 12 outside the portion 17 of the layer defined by the $p^+$-region 16 in order that in view of the very high resistivity of the layer 12 the p-n junction between the $p^+$-region 16 and the part of the layer 12 outside the $p^+$-region 16 should not become forward biased.

On the insulating layer 14 there is an electrode system provided for the transfer of charge representative of information via the interior of the layer between storage sites below and associated with the individual electrodes of the system. This electrode system comprises a plurality of groups of electrodes $\phi_1$, $\phi_2$, $\phi_3$ and $\phi_4$ of which the electrodes $\phi_x$, where $x = 1, 2, 3$ or $4$ in the different groups are interconnected. These interconnected electrodes are connected to one source of clock voltages indicated diagrammatically by $CP_1$ in FIG. 4. The electrodes $\phi_1$, $\phi_2$, $\phi_3$ and $\phi_4$ of any one such group consist alternately of phosphorus doped polycrystalline silicon and aluminium and are arranged as shown in FIG. 5 such that the electrodes $\phi_2$ and $\phi_4$ which are of aluminium are situated on parts of the insulating layer of greater thickness than those on which the the electrodes $\phi_1$ and $\phi_3$ of polysilicon are situated. Furthermore in this embodiment the longitudinal edges of the aluminium electrodes $\phi_2$ and $\phi_4$ are in overlapping relationship and insulated from the longitudinal edges of the polysilicon electrodes $\phi_1$ and $\phi_3$. In FIG. 4 all aluminium electrodes including the electrodes $\phi_2$ and $\phi_4$ and connection conductors are shown in full lines and all polysilicon electrodes including the electrodes $\phi_1$ and $\phi_3$ are shown in chain lines. In the direction normal to the direction of charge transport and parallel to the opposite major sides of the n-type layer 12 the electrodes $\phi_1 - \phi_4$ extend completely across the entire width of the portion 17 of the layer 12 defined between the oppositely located parts of the $p^+$-region 16.

For the purpose of convenience of illustration only two full groups of electrodes $\phi_1 - \phi_4$ are shown in FIG. 4, these being the group adjacent the charge input means and the group adjacent the charge read-out and output means. The input means when in the form of electrically introducing signal charge may be of any suitable form for a charge coupled device in which the charge is transported via the interior of the semiconductor layer. In the present embodiment the input means comprise an n+-surface region 20 having a connection conductor 21 and situated adjacent thereto electrodes 22 and 23 on the insulating layer 14 and respectively consisting of polysilicon and aluminium. The adjoining longitudinal edges of the electrodes 22 and 23 are in overlapping relationship as also are the adjoining longitudinal edges of the aluminium electrode 23 and the polysilicon electrode $\phi_1$ of the first group of electrodes $\phi_1 - \phi_4$.

In the direction of charge transport as indicated by the arrow 18A following the last electrode $\phi_4$ of the last group $\phi_4 - \phi_4$ there is a further system of electrodes provided on the insulating layer and comprising electrodes 25, 26, and 27 which are associated with another source of clock voltages indicated by $CP_2$ in FIG. 4 and respectively correspond to the electrodes I, G and O in FIG. 1. This further system of electrodes also comprises a screening electrode 28. Centrally situated in the n-type signal charge transfer channel region 17 there is a p+-island surface region 29 which, in this embodiment, corresponds in doping and depth with the p+-line region 16. The electrode 25 which forms an input electrode of the read-out means is of polysilicon and extends across the entire width of the signal charge transfer channel. The electrode 27 which forms an output electrode of the read-out means is also of polysilicon and extends completely across the width of that part of the n-type layer 17 between the p+-region 29 and the part of the p+-region 16 on one side of the p+-region 29. The screening electrode 28 which is of aluminium extends completely across the width of that part of the n-type layer 17 betwen the p+-region 29 and the part of the p+-region 16 on the opposite side of the p+-region 29 and serves when maintained at a suitable potential for the diverting of the charge packets as they are transported via the interior of the layer 17 to the part 31 of the layer 16 situated between the electrodes 25 and 27. Above this part 31 of the n-type layer the electrode 26 of aluminium is present on the insulating layer 14.

The adjoining longitudinal edges of the electrodes $\phi_4$ and 25 are in overlapping relationship as also are the adjoining longitudinal edges of the electrodes 25 and 26 and of the electrodes 25 and 28. As is clearly shown in FIGS. 4 and 5 the electrode 26 overlaps along one edge the electrode 27. In the part 31 of the n-type layer situated below the electrode 26 and between the facing longitudinal edges of the electrodes 25 and 27, said part forming the channel for the diverted charge transported from the input means, there is a more highly doped n-type surface region 33 formed, for example, by ion implantation. This more highly doped n-type surface region 33 extends from the p+-region 29 across the part 31 of the n-type layer towards but not in contact with the p+-region 16. The periphery of the n-region 33 is indicated by a continuous line of dots.

In the operation of the device the electrodes 25, 26 and 27 serve, on application of appropriate clock voltages to the electrodes 25 and 27, for transporting the charge packets from the final electrode $\phi_4$ sequentially below the electrodes 25, 26 and 27 to the charge draining means. In this embodiment the charge draining means consists of an n+-surface region 34 having a connection conductor 35. It is when a charge packet is present in a storage site below the electrode 26 that the reading of the charge packet is carried out. In operation the p+-region 29 constitutes the source region of an enhancement type insulated gate field effect transistor of which the drain region is formed by the p+-region 16 and the gate electrode by the aluminium electrode 26. Ohmic connection to the p+-region 16 is made via an aperture 36 in the insulating layer 14 with a connection conductor 37. This operation is effected with the gate electrode 26 maintained at a constant potential and such that even with no charge packet below the gate electrode there may be a standing current between the source and the drain region. The presence of the n-region 33 provides a potential distribution such that the hole current in the vicinity of the surface and the charge packet of electrons in the interior of the layer may be simultaneously confined to the part of the layer below the gate electrode 26 where the region 33 is present without mixing. The emission of holes from the source region 29 only one one side thereof, that is into the surface portion of the part 31 of the layer in which the signal charge transfer channel is present, is caused by the negative bias on gate electrode 26 making the surface potential more negative in this area while the increased doping makes the interior of the layer more positive in this area. The separation of the n-region 33 from the adjoining inner edge of the p+-region 16, forming the transistor drain, is approximately 3 microns and is provided in order to avoid the presence of a low breakdown voltage junction. This does not effect the operation of the transistor because in most operational circumstances in the non-implanted surface region below the gate electrode 26 in this interval there will be an accumulation of holes due to the negative bias on gate electrode 26 and this area will effectively form an extension of the drain region. The electrons in a charge packet when transported to the storage site in the interior of the layer below the gate electrode 26 will cause the source region to emit more holes into the transistor channel because with the constant gate voltage the surface potential in the transistor channel area will be tied substantially to the source potential. Thus an increase in the source to drain current will occur and this will therefore be dependant upon the number of electrons in the charge pocket.

FIG. 4 shows the circuit connection of a resistor R in the series path between the source electrode 38 connected to the p+-source region 29 and the bias source of +5 volts. The output O/P of this 'Floating Surface' charge amplication stage (FSA) is taken as shown and the variation in potential at this point as determined by the charge packets as they are temporarily stored in the interior of the layer under the gate electrode forms the input of an externally connected further stage of amplification which in operation is connected as shown in FIG. 4.

The actual potentials applied to the various electrodes and regions will now be described and all potentials as stated are with respect to the p-type substrate 11 which is at earth potential. The electrode 19 connected to the part of the n-type layer outside the p+-region 16 is maintained at a constant potential of +5 volts. The electrode 35 at the end of the signal charge transfer channel beyond the read-out means and serving for draining the transported charge after read-out is maintained at a constant potential of +15 volts. The electrode 37 connected to the p+-region 16 forming the transistor drain is maintained at a constant potential of −2 volts. The screening electrode 28 which serves for diversion of the charge packets into the part 31 of the layer since it must never be more positive than the preceding electrode 25 is maintained at substrate potential.

For the introduction of the charge packets of electrons various possibilities exist with the structure shown. The electrode 21 may be maintained, apart from when it is desired to introduce a charge packet, at a potential of +15 volts. For a digital input the electrodes 22 and 23 may be connected to the clocking electrode lines $\phi_3$ and $\phi_4$ respectively and the electrode 21 pulsed from 15 volts to 10 volts to introduce each charge packet. For an analog input for some signal processing applications the electrodes 22 and 23 may be connected to independent pulse generators or to independent D.C. voltage source in a wide variety of different manners and the analog signal applied to electrode 21. The four-phase clock voltages from the source applied to the main electrode system $\phi_1 - \phi_4$ lie between 0 volts and 6 volts. The so-called two-and-a-half phase clock voltages from the other source of clock voltages applied to the electrodes 25 and 27 also lie between 0 volts and 6 volts, the gate electrode 26 being maintained at a constant potential of −5 volts.

The waveforms of the clock voltages will be described hereinafter but initially the potential distribution in the n-type layer part 17 under various electrodes will be described with reference to FIG. 7. In this Figure the potentials are as shown on the ordinate line and the insulating layer 14, n-type layer part 17 and p-type substrate 11 as shown. The line A is the potential distribution under the gate electrode 26 where the more highly doped n-region 33 is present, the line B is the potential distribution under any clocking electrode when it is at its most negative potential, i.e. zero volts, and the line C is the potential distribution under any clocking electrode when it is at its most positive potential, i.e. +6 volts.

From this Figure it is seen that the surface potential is most negative under the gate electrode 26 and this confines the hole current in the vicinity of the surface to the region under the gate electrode 26 where the n-region 33 is present. Also it is seen that the potential 'well' below the gate electrode 26 is more positive than under the adjacent electrodes 25 and 27 when said electrodes are at their least positive potential (Curve B) and is more negative than under the adjacent electrodes 25 and 27 when said electrodes are at their most positive potential (Curve C). This enables the desired charge coupled device action of transport of charge via the interior of the layer successively under the electrode 25, 26 and 27 without mixing between the electrons in a charge packet when stored in the vicinity of the potential well under the gate electrode 26 and the mobile holes in the transistor channel at the surface.

FIG. 8 shows the waveforms of the clock voltages. The clock voltages applied to the electrodes $\phi_1 - \phi_4$ are conventional four-phase clock voltages but the clock voltages applied to the electrodes 25 and 27 associated with the read-out means have an asymmetric mark-space ratio. In order to maximize the dwell time of a charge packet under the gate electrode 26, during which time the read-out is effected, the duration during which the clock voltages of +6 volts is applied to the input and output electrodes 25 and 27 of the read-out means is made relatively short. In this manner the dwell time under the gate electrode 26 is nearly three times the dwell time of a charge packet below any one of the electrodes $\phi_1 - \phi_4$. The sampling time during which the charge packet of electrons in the storage site below the gate electrode 26 is read by the means responsive to the transistor source to drain current is indicated in FIG. 8 by $t$.

Some dimensions of the various regions and layers present in the device shown in FIGS. 4 to 6 will now be given.

The n-type epitaxial layer 12 is of 4 microns thickness and the $p^+$-diffused region 16 extends into the layer to a depth of 2 microns. The width of the signal charge transfer channel 17, that is the cross-dimension normal to the direction of charge transport may be 40 microns. In a direction parallel to the direction of charge transport the widths of the various electrodes are as follows:

| | |
|---|---|
| Clocking electrodes $\phi_1$ and $\phi hd 3$ | = 10 microns |
| Clocking electrodes $\phi_2$ and $\phi_4$ | = 10 microns |
| Input electrodes 22 and 23 | = 10 microns |
| Read-out means input electrode 25 | = 20 microns |
| Read-out means output electrode 27 | = 15 microns |
| Gate electrode 26 | = 25 microns |
| Screening electrode 28 | = 20 microns |

The corresponding dimension of the n-region 33 is 15 microns and its dimension in a direction normal to the direction of charge transport is 10 microns.

It is to be noted that as the n-layer is of only 4 microns thickness and the $p^+$-region 16 is of 2 microns depth, there exists the possibility that if close control of these dimension cannot be assured in manufacture then the $p^+$-region 16 may be directly connected to the p-type substrate 11 and hence have its potential fixed at earth potential. This may necessitate the application of correspondingly more positive voltages to all the other electrodes to maintain the operation of the device substantially unaffected.

This embodiment provides a high responsivity non-destructive read-out amplification stage with low noise. The input capacitance is low and the amplication stage is accommodated within the signa charge transfer channel. It will be appreciated that by the need for the diversion of the charge packet to the part 31 of the n-type layer, that into a cross-sectional are area in a plane normal to the direction of charge transort which is slightly less than one-half that of the corresponding cross-sectional area in the main part of the signal charge transfer channel below the clocking electrodes $\phi_1 - \phi_4$, the charge handling capacity of the device for a given surface area of the part 17 of the n-type layer is reduced. However this should be compared with the good signal to noise ratio that the novel read-out charge amplification means can provide.

It is of course possible by a modifiction in which the screening electrode 28 is omitted and two regions 33 are provided one on each side of the $p^+$-source region 29 to have an embodiment where the charge packet is divided and moved below a pair of transistor gate electrodes situated above the n-layer part 17 at opposite sides of the $p^+$-source region 29. However this would simply constitute two amplification stages of the form present in the embodiment described and operating in parallel with a higher input capacitance and thus a lower sensitivity.

Figure 9:
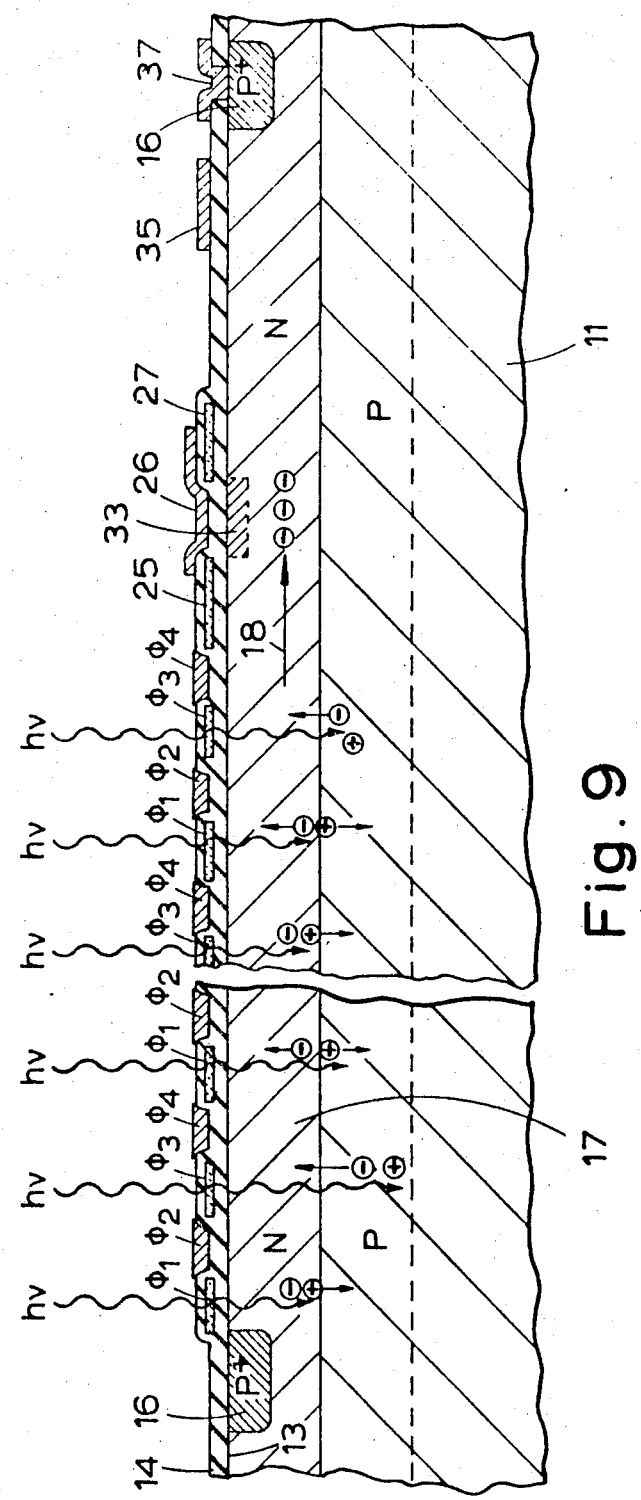

A further embodiment of the invention will now be described with reference to FIG. 9. This embodiment is a modification of the embodiment described with reference to FIGS. 4 to 6 and differs in that it is a charge coupled device suitable for imaging purposes in which the charge is transported via the interior of the semiconductor layer. In this device the structure differs from that shown in FIGS. 4 to 6 only in terms of the means whereby charge representative of information is introduced into the n-type layer. FIG. 9 is a cross-section through part of the device taken in a plane parallel to the direction of charge transport and adjacent opposite ends of the charge transfer channel. Electrodes and regions in FIG. 9 which correspond with those present in FIGS. 4 to 6 are indicated by the same reference numerals. Thus the device comprises a p-type substrate of 30 ohm. cm. resistivity and 200 microns thickness having thereon an n-type epitaxial layer of 8 ohm. cm. resistivity and 4 microns thickness. At the lateral extremities of the charge transfer channel there is a $p^+$-region 16 of the form as present in the device shown in FIGS. 4 to 6.

There are no separate input electrodes in the imaging charge coupled device shown in FIG. 9 the first clocking electrode $\phi_1$ which extends across the width of the charge transfer channel being situated adjacent the parallel part of the $p^+$-region at the end of the channel. In operation the upper surface of the device is subjected to illumination from a scene by suitable optical means and photons incident on the upper surface can pass into the n-type semiconductor layer part 17 through the semi-transparent polysilicon electrodes $\phi_1$ and $\phi_3$. During this process at least one of each group of electrodes $\phi_1 - \phi_4$ is maintained at zero volts while at least one other electrode in each group of said electrodes is maintained at +6 volts.

Photons which thus pass into the part 17 of the n-type layer and are absorbed whithin the fully depleted parts of the n-type layer or within the depletion region associated with the p-n junction between the n-type layer part and the p-type substrate will yield electron-hole pairs. These electron-hole pairs will be separated by the electric field present with the holes flowing to the substrate and the electrons flowing to the positions of minimum potential in the n-type layer. Thus over a certain period of imaging, for example 40 milliseconds, a charge pattern representative of the illumination of the scene being imaged is built up in the form of a plurality of buried charge packets each located below an electrode or group of electrodes maintained at +6 volts. This information representing charge is transported via the interior of the part 17 of the n-type layer by applying suitable clocking voltages to the electrodes $\phi_1 - \phi_4$ until it reaches the read-out means which are essentially the same as those described with reference to FIGS. 4 to 6. Various schemes for synchronizing the imaging periods and the charge transfer periods and for effecting the serial read-out of the charge packets are possible and obviously more complex imaging embodiments are possible in which the information representing charge pattern generated in storage sites distributed over an area is transferred sequentially to a read-out means. In all these embodiments the read-out means will be essentially the same in structural and operational principle to that as shown in part in FIG. 9.

A further embodiment of the invention will now be described with reference to FIG. 10 of the accompanying drawings. This embodiment constitutes a further modification of the embodiment previously described with reference to FIGS. 4 to 6. It differs in so far as means are present for transporting the charge packets after read-out to another part of the semiconductor layer via storage sites associated with a further system of electrodes and via the interior of the layer. Thus this embodiment shows a non-destructive read-out stage in which the charge packets instead of being drained from the layer after read-out, as occurs in the operation of the embodiment described with reference to FIGS. 4 to 6, are further transported via the interior of the layer to another part of the layer. Corresponding parts and electrodes are indicated in FIGS. 4 and 10 with the same reference numerals. The device shown in FIG. 10 also differs in so far as a three-phase system is present for the charge transfer to and from the reading means. In this three-phase system the clocking electrodes $\phi_1$, $\phi_2$ and $\phi_3$ in any one group consist of phosphorus doped polycrystalline silicon all insulated from one another and arranged at different distances from the silicon surface with their adjoining edges in overlapping relationship, the electrodes $\phi_1$ being situated closest to the silicon surface and the electrodes $\phi_3$ being situated furthest from the silicon surface. Thus as is shown in the plan view of FIG. 10 the read-out means are provided, in the direction of charge transport, following a clocking electrode $\phi_3$ of one group and preceding a clocking electrode $\phi_1$ of the next group. In this embodiment the three electrodes 25, 26 and 27 which define a continuation of the charge transfer channel between said clocking electrode $\phi_3$ of the preceding group and said clocking electrode $\phi_1$ of the following group all extend from the $p^+$-island region 29 in the same direction. The electrode 25 corresponding to the electrode I in FIG. 1 and the electrode 27 corresponding to the electrode 0 in FIG. 1 are both of polysilicon and at the same levels above the silicon surface as the clocking electrodes $\phi_1$ and $\phi_3$ respectively. The electrode 26 forming the gate electrode of the read-out transistor is of aluminium and overlaps along opposite longitudinal edges the edges of the polysilicon electrodes 25 and 27. Extending above the n-type layer on the opposite side of the $p^+$-island region 29 there is a screening electrode 41 also of polysilicon and at the same level above the silicon surface as the clocking electrodes $\phi_2$. This electrode is provided with one longitudinal edge in overlapping relationship with the clocking electrode $\phi_3$ preceding the read-out means and another longitudinal edge in overlapping relationship with the clocking electrode $\phi_1$ following the read-out means. Ohmic connection to the $p^+$-island region 29 is via an aluminium electrode 42.

The operation of the device shown in FIG. 10 may be entirely analogous with that described for the device shown in FIGS. 4 to 6 with the electrodes 25 and 27 connected to a separate source of clock voltages in order to maximize the dwell time of the charge packets under the gate electrode 26. If for the purpose of the read-out it is sufficient that the dwell time of a charge packet under the gate electrode 26 is the same as the dwell time of a charge packet under any of the clocking electrodes $\phi_1 - \phi_3$ then the electrodes 25 and 27 may be connected to the same common lines as the electrodes $\phi_1$ and the electrodes $\phi_3$ respectively.

FIGS. 11 and 12 are a plan view and section of part of another embodiment of a semiconductor device in accordance with the invention. This embodiment also consists of a charge coupled device in which the charge transport is via the interior of the semiconductor layer and in which the novel read-out means are provided at an intermediate location in the signal charge transfer channel between two groups of clocking electrodes. The device employs a three-phase system for the charge transport of the same form as in the preceding embodiment, that is using clocking electrodes in groups of three electrodes $\phi_1$, $\phi_2$ and $\phi_3$ all of polysilicon and in any one group the electrodes $\phi_1$, $\phi_2$ and $\phi_3$ being at increasing distances from the silicon surface. The electrodes 45 and 47, corresponding to the electrodes I and O in FIG. 1, are also of polysilicon and at the same level as the clocking electrodes $\phi_1$ and $\phi_3$ respectively. The gate electrode 46 in this embodiment differs in so far as it is also of polysilicon and present at the same level as the clocking electrodes $\phi_2$. Furthermore the gate electrode 46 overlaps the entire periphery of a p$^+$-island surface region 49 and extends across the entire width of the part of the n-type layer bounded by oppositely located portions of a common p$^+$-region 16. Ohmic connection to the p$^+$-region 49 is made via a connection conductor 50.

In this device at the surface of the n-type layer 12 on the p-type substrate there is a more highly doped n-surface region 52. This n-surface layer 52 facilitates an improvement in the charge handling capacity of a charge coupled device in which the charge transport is via the interior of the semiconductor layer. For a full description of the advantageous operation of such a device reference is invited to co-pending Patent Application No. 11974/74 which corresponds to U.S. application Ser. No. 450,996. The n-surface layer 52 extends throughout the surface of the n-type layer bounded by the p$^+$-region 16 with the exception of the p$^+$-region 49. This device represents a simplification in structure compared to the previously described embodiments in so far as no additional localized n-type regions are necessary in order to form the desired potential distribution under the transistor gate to confine the transistor current and no additional electrodes are required for diverting the charge along a specific path in the n-type layer. Again this device comprises a sensitive charge amplification read-out stage in which all the potentials are clearly defined. In view of the larger area of the gate electrode, for a given cross-sectional area of the main part of the charge transfer channel and charge handling capacity as thereby determined, the sensitivity may be somewhat less than in the preceding embodiments. Nevertheless it is calculated that the performance of the charge reading amplification means for reading medium and large size quantities of charge should be none less than a prior art floating gate amplifier. The manufacture of this device may be readily achieved, the described problems of reproducibility and stability not occurring because there are no floating electrodes having indeterminate quantities of charge sealed thereon.

In the operation of the device shown in FIGS. 11 and 12 the clocking voltages applied to the main clocking electrodes $\phi_1$-$\phi_3$ vary between +5 volts and −5 volts. The p$^+$-region 16 forming the transistor drain is at −5 volts with respect to the substrate. The p$^+$-region 49 forming the transistor source is connected via a resistor R to a bias source of +5 volts and the output signal O/P is derived as shown in FIG. 11. The clocking voltages applied to the electrodes 45 and 47 vary between +5 volts and −5 volts, the gate electrode 46 being maintained at earth potential.

It will be appreciated that more than one charge read-out stage of the form shown in FIGS. 11 and 12 may be present in any one signal charge transfer channel. Furthermore instead of being intermediately situated in a signal charge transfer channel as shown in FIGS. 11 and 12 the read-out means may alternatively be situated at the end of such a channel immediately preceding the charge draining means, for example as present in the embodiment described with reference to FIGS. 4 to 6. In a modified form the device shown in FIGS. 11 and 12 is constructed without the presence of the n-surface region 52. In that case the charge handling capacity for a given cross-sectional area of the n-type layer bounded by the p$^+$-region 16 is lower. In a further modification of the embodiment shown in FIGS. 11 and 12, for simplicity of structure and operation, the electrodes 45 and 47 are connected to the same lines as the clocking electrodes $\phi_1$ and $\phi_3$ respectively. However, this will reduce the period during which the charge dwells under the gate electrode 46 so reducing the signal to noise ratio.

In the embodiments so far described the read-out transistor is formed with one of the first and second regions of the opposite conductivity type, that is the source and drain, constituted by a p$^+$-island surface region located within the part of the layer comprising the signal charge transfer channel and with the other of said first and second regions of the opposite conductivity type formed by a p$^+$-surface region situated along a lateral boundary of the channel. Thus to provide the transistor regions only one extra p$^+$-region is required in the device structure. Further embodiments will now be described in broad outline detail in which other possibilities for forming the transistor regions are employed, namely where no additional p$^+$-regions are provided and where two additional p$^+$-regions are provided.

Figure 13:
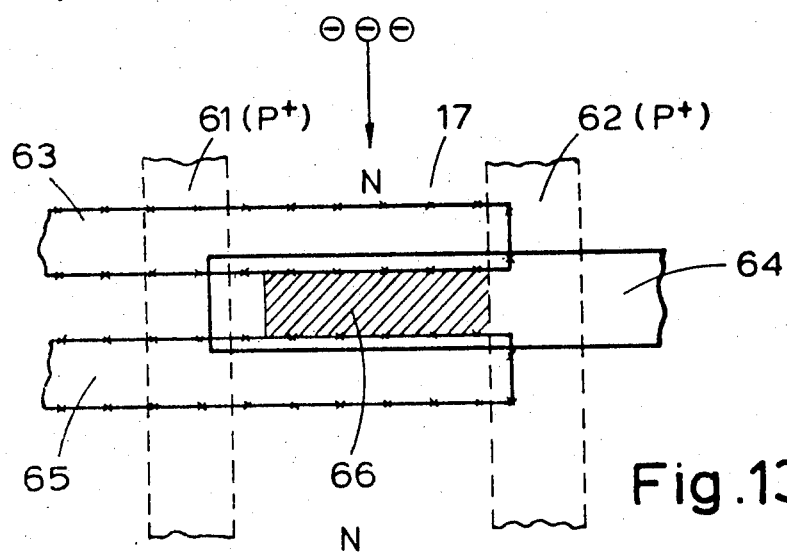

Referring now to the plan view of FIG. 13, in this embodiment the n-type epitaxial layer part 17 is laterally bounded along opposite longitudinal edges extending in a direction parallel to the direction of charge transport by separate p$^+$-regions 61 and 62 which are not interconnected. These p$^+$-regions 61 and 62 extend only partly through the epitaxial layer. Electrodes 63 and 65 which are of polysilicon and separated from the silicon surface correspond to the electrodes I and O in FIG. 1. The electrode 64 is of aluminium and forms the gate electrode of the read-out transistor of which in operation the source is the p$^+$-region 62 and the drain is the p$^+$-region 61. A locally provided more highly doped n-type surface region 66 is present in the transistor channel below the gate electrode 64 and adjoins the p$^+$-source region 61 but is spaced from the p$^+$-drain region 62. The region 66 serves to provide the desired potential distribution below the gate electrode 64 in order to obtain the desired transistor action while confining the stored charge packet to the interior of the part 17 of the n-type layer without mixing between the electrons in the stored charge packet and the mobile holes in the transistor channel. The operation of this device is similar to that described with reference to FIGS. 4 to 5. The clocking voltages applied to the main clocking electrodes (not shown) vary between 0 volts and +6 volts and the clocking voltages applied to the electrodes 63 and 65 vary between 0 volts and +6 volts, all voltages stated here being with respect to the p-type substrate which is normally at earth potential. The p$^+$-region 62 forming the source is connected via a resistor to a supply of +5 volts and the p$^+$-region 61 forming the drain is maintained at −2 volts. The gate electrode 64 is maintained at a constant potential of −5 volts. This device may be constructed with the read-out stage as shown in FIG. 13 present at an intermediate location along a signal charge transfer channel or at the end of a signal charge transfer channel immediately preceding a charge draining means. The device may be constructed for operation for example in two, three or four phase mode for the transport of charge via the interior of the n-type layer to the charge reading means.

Figure 14:
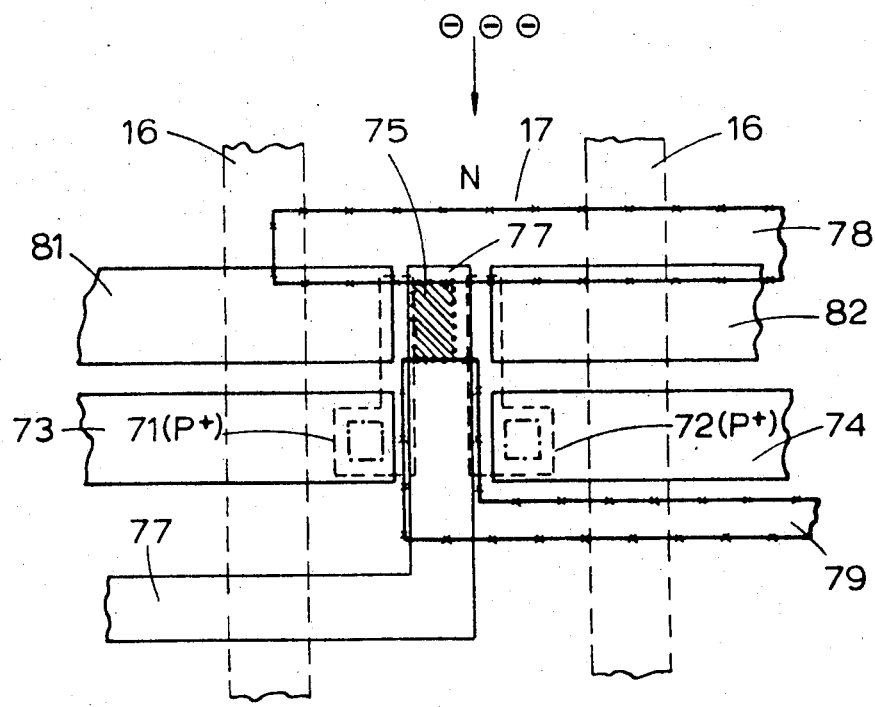

FIG. 14 shows in plan view part of a device in which both the source and drain regions of the read-out transistor are separately provided as p+-island surface regions in the CCE channel area. This device comprises a p+-surface region 16 extending only partly through the epitaxial layer, as in the device shown in FIGS. 4 to 6, and having oppositely located portions laterally bounding the part 17 of the n-type layer. The transistor source and drain regions are formed by p+-island surface regions 71 and 72 having connection conductors 73 and 74 respectively. In the area of the transistor channel region there is a more highly doped n-type surface region 75 which adjoins the p+-source region 71 but is spaced from the p+-drain region 72. The region 75 serves to provide the desired potential distribution below the transistor gate electrode 77 in order to obtain the desired transistor action while confining the stored charge packet to the interior of the n-type part 1 of the layer without mixing between the electrons in the stored charge packet and the mobile holes in the transistor channel. Electrodes 78 and 79 are of polysilicon and correspond to the electrodes I and O in FIG. 1, the electrode 78 being provided adjoining the last electrode of a group of clocking electrodes associated with the charge storage and transport to the reading means. Screening electrodes 81 and 82 of aluminium are present on the insulating layer adjoining the electrodes 75 and situated over those parts of the n-type layer from which it is desired to divert the charge, these parts being situated between the p+-regions 71, 72 and the adjoining portion of the p+-region 16.

In the operation of the device shown in FIG. 14 the p+-region 16 is maintained at substrate potential as also are the screening electrodes 81 and 82. The clocking voltages applied to the main clocking electrodes associated with the charge storage and transport via the interior of the layer range between 0 volts and +6 volts. The device may be constructed for operation, for example in a two, three or four phase mode. The clocking voltages applied to the electrodes 78 and 79 range between 0 volts and +6 volts, the gate electrode 77 being maintained at a constant potential of −5 volts. The drain electrode 74 is maintained at −2 volts and the source electrode 73 connected via a resistor, from the end of which the output is taken, to a supply of +5 volts.

Figure 15:
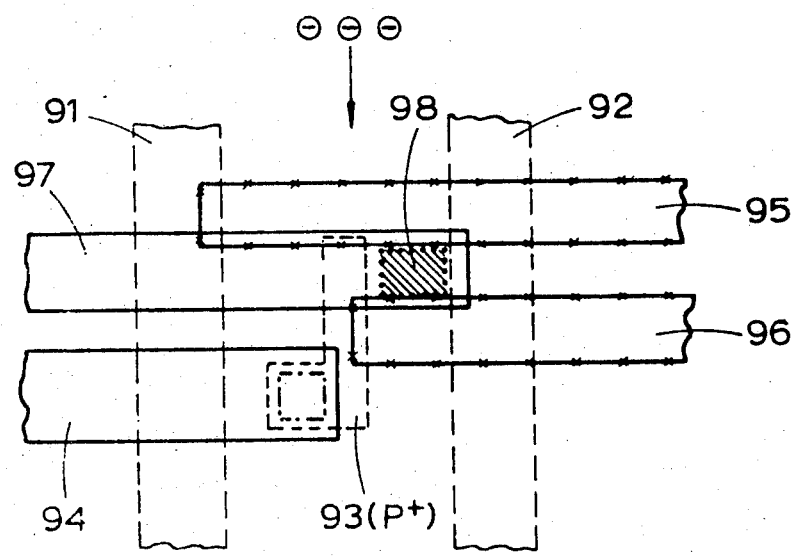

An embodiment will now be described with reference to FIG. 15 in which a single additionally provided p+-region has to be used in the circuit operation as the transistor drain. In this device the part 17 of the n-type layer is laterally bounded along opposite longitudinal edges in the direction of charge transport by separate p+-surface regions 91 and 92 extending only partly through the epitaxial layer. In the circuit operation the region 92 constitutes the source of the transistor, the transistor drain being formed by a p+-island surface region 93 having a connection conductor 94. Electrodes 95 and 96 of polysilicon correspond to the electrodes I and O in FIG. 1 and are situated in the direction of charge transport on opposite sides of the transistor gate electrode 97. A locally provided more highly doped n-type surface region 98 is present below the gate electrode 97 and extends adjoining the source region 92 but spaced from the drain region 93. This ensures that although electrode 97 is always more negative than the adjacent electrodes 95 and 96 the potential in the interior of the layer below electrode 97 is such that charge packets may be introduced and confined there by the action of the applied clocking voltages and will not pass under the part of electrode 97 where the more highly doped region 98 is absent.

In operation the source electrode connected to the p+-region 92 is connected to a voltage source of +2 volts and the p+-region 91 is maintained at −5 volts. The main clocking electrodes (not shown) are supplied with clock voltages which range between 0 volts and +6 volts and the electrodes 95 and 96 are supplied with clock voltages which range between 0 volts and +6 volts. The drain electrode 94 is connected via a resistor to a source of −8 volts and the gate electrode 97 is maintained at −5 volts. In this embodiment and also in the embodiment described with reference to FIG. 13 in operation there exists a voltage difference between different p+-regions which are employed for partly isolating the semiconductor layer part in which the charge transfer channel is present. Thus there may exist limitations of the minimum possible thickness of the n-type layer in order to avoid the possibility of a connection between such a p+-surface region and the p-type substrate on which the n-layer is present.

It will be appreciated that many modifications of the so far described charge coupled devices are possible within the scope of the present invention. Thus for those devices which are constructed for imaging applications, instead of the structure being provided for receiving the incident light or radiation on the side at which the clocking electrodes are present, the structure may be provided for receiving the light or radiation on the substrate side when the substrate is of a sufficiently small thickness.

In all the embodiments described the signal charge transfer channel is shown as being of substantially uniform width. However, if desired the signal charge transfer channel may show a local variation in width in the vicinity of the read-out transistor in order to accommodate the additionally provided region or regions of the opposite conductivity type forming one or both of the transistor source and drain regions.

In the operation of the embodiments described with reference to FIGS. 4 to 6 and FIG. 10 the p+-island surface region is employed as the transistor source region and the p+-region 16 laterally bounding the signal charge transfer channel is employed as the drain region. It is possible in modified forms of these structures in which the more highly doped n-regions also abut the p+-region 16 to interchange the source and drain and the voltages applied thereto.

The output signal is described in some of the embodiments as being derived from a point between the transistor source and a load resistor in the series path between the source and a D.C. bias source and being fed to an external amplifier. However other arrangements are possible for deriving the output signal, for example in place of such a resistor in series with the read-out transistor there may be employed the main current path of another insulated gate field effect transistor which is provided within the same semiconductor body. Furthermore it is possible to operate the device, or form the device, such that the read-out transistor has the gate electrode and the drain permanently commonly connected in which case in the examples described the common potential applied to the gate and drain potential is the stated value applied to the gate.

A further embodiment of a semiconductor device in accordance with the invention will now be described with reference to FIGS. 16 and 17 of which FIG. 17 is a cross-sectional view taken along the line XVII—XVII of the plan view of FIG. 16. This device comprises a photo-detector element having a p-type substrate 101 and n-type epitaxial layer 102 thereon, the substrate and epitaxial layer each having a thickness and doping corresponding substantially to those in the embodiment described with reference to FIGS. 4 to 6. On the surface 103 of the epitaxial layer 102 there is an insulating layer 104. A p$^+$-surface region 106 extends into but not through the epitaxial layer 102. This p$^+$-surface region 106 is of a closed configuration with the exception of a small opening 107 of a few microns width. Situated internally of the p$^+$-region 106 there is an island p$^+$-region 108 of corresponding doping and thickness. On the surface of the insulating layer 104 there is an electrode system consisting of two electrodes 120 and 121 both of phosphorus doped polycrystalline silicon and extending at different levels above the silicon surface, the electrode 120 being situated closer to the silicon surface than the electrode 121. The polysilicon electrode 120 is of substantially rectangular configuration in so far as its inner periphery overlaps the outer periphery of the p$^+$-island surface region 108 and the outer periphery is rectangular with the exception of the portion forming a read-out conductor. The polysilicon electrode 121 is also of substantially rectangular configuration in so far as its outer periphery overlaps the inner periphery of the p$^+$-region 106 and its inner periphery overlaps the main part of the outer periphery of the polysilicon electrode 120. The electrodes 120, 121 thus form a pair of overlapping charge transfer electrodes. The p$^+$-regions 106 and 108 form the source and drain of an insulated gate field effect transistor of which the charge transfer electrodes 120,121 together also constitute gate electrode parts. The p$^+$-region 108 is provided with a connection conductor 112 and the p$^+$-region 106 is provided with a connection conductor 113. Adjoining the interruption 107 in the p$^+$-region 106 there is an n$^+$-surface region 114 in the n-type epitaxial layer 102 which is provided with a connection conductor 115.

Operation of the device as a photo-detector element will now be described. The incident radiation is directed at the upper surface and the semi-transparent polysilicon electrodes 120 and 121 are so constructed to transmit radiation in the wavelength range for which the device is to be sensitive. During the detection period the part of the epitaxial layer below the electrodes 120 and 121 and lying within the p$^+$-region 106 is fully depleted and is isolated from the surroundings. This is achieved by applying potentials (all stated with respect to the p-type substrate potential which is at earth potential) of +10 volts to the conductor 115, −5 volts to the conductor 113, −5 volts to the electrode 121 and maintaining the electrode 120 at the substrate potential (0 volts). Electron-hole pairs generated on absorption of the incident radiation within the fully depleted part of the layer 102 or the depletion region in the substrate 101 below said part of the layer will be separated by the electric field with the holes flowing to the p-type substrate and the electrons flowing to the potential minima in the interior of the n-type epitaxial layer 102. Due to the inner electrode 120 being at a more positive potential than the outer electrode 121 the fringing fields in the epitaxial layer will be effective in causing those electrons generated under electrode 121 to drift to a position in the interior of the layer under the inner electrode 120. Thus with the exception of a small percentage of electrons lost to the non-depleted part of the n-type layer via the opening 107 in the p$^+$-region 106 the free electrons produced by absorption of the incident radiation will finally be confined to the interior of the n-type epitaxial layer 102 below the electrode 120. During this imaging period the region 108 forming the transistor source is connected via a resistor R to a supply of +5 volts. The transistor source-drain current will increase as more electrons are introduced into the layer and collect in the storage site below the electrode 120 forming part of the transistor gate electrode because as the surface potential is tied to the source potential more holes will be introduced into the transistor channel to balance the increased electron concentration in the interior of the layer below the electrode 120. Thus over a certain period the transistor current will increase with the radiation incident as described and will be a measure of the total radiation incident in that period. At the end of a frame period, in order to remove the electrons stored under the electrode 120 the outer electrode 121 is temporarily pulsed to +1 volt. The electrons will be transferred to a position under electrode 121 from where they will be removed via the opening 107 in the p$^+$-region 106 due to the more positive potential of the n-type layer outside the p$^+$-region 106 than exists inside said region. On relaxing the potential applied to electrode 121 back to −5 volts a new frame period commences and the imaging action as described is repeated.

It will be appreciated that a plurality of such photo-detector elements can be formed in a common semiconductor body with outputs individually associated with the elements. Furthermore it is also possible to provide in such a structure comprising a plurality of photo-detector elements electroluminescent or other display means in series with the source-drain path of each read-out transistor.

Further embodiments of the invention will now be described, the devices of these embodiments consisting of charge coupled devices having bulk transport and comprising insulated gate field effect transistor read-out means at each of a plurality of succesively situated charge storage and transfer bits of a charge transfer line.

Thus the device shown in FIGS. 18 to 20 is a bulk channel charge coupled device in which each of a plurality of successive charge storage and transfer stages (bits) in a single charge storage and transfer line is separately accessible by means of the provision of a separate insulated gate field effect transistor structure charge reading means. In the drawings which are purely diagrammatic the various section shadings and form of lines have the same notation as present in the previously described Figures. For the sake of clarity of illustration only two charge storage and transfer stages (bits) are shown but it will be appreciated that the device comprises a large number, in this example 100, charge storage and transfer stages in a single line.

The device comprises a p-type silicon substrate 201 of 30 ohm. cm. resistivity and 200 microns thickness having thereon an n-type silicon epitaxial layer 202 of 8 ohm. cm. resistivity and 4 microns thickness. On the upper surface 203 of the epitaxial layer 202 there is insulating material 204 consisting of silicon oxide layer parts of different thickness. In the epitaxial layer 202 there is a p$^+$-diffused surface region having parallel extending strip parts 206 which serve to define the boundaries, in a direction parallel to the direction of charge transport as indicated by the arrow in FIG. 19, of a charge transfer channel 207 in the n-type material of the layer 202. In operation the portion 207 of the n-type layer is isolated from its surroundings, with the exception of the means for introducing and withdrawing charge from this portion of the layer, by reverse biasing the p-n junction between the p-type substrate 201 and the n-type layer 202 and by reverse biasing the p-n junction between the p$^+$-region 206 and the n-type layer 202 such that the depletion region associated with said junction extends at least to the depletion region associated with the said reverse biased substrate/layer p-n junction. For the sake of convenience of illustration further connections to the n-type layer outside the portions 207 bounded by the p$^+$-region 206 are not shown. On the insulating layer parts there is an electrode system provided for the capacitive generation of electric fields for the transfer of charge representative of information via the interior of the semiconductor layer. This electrode system comprises a plurality of groups of electrodes $\phi_1$, $\phi_2$, $\phi_3$. The adjacently situated edges of the electrodes $\phi_1$ and $\phi_2$ are in overlapping relationship, as also are the adjacently situated edges of the electrodes $\phi_2$ and $\phi_3$ and the adjacently situated edges of the electrodes $\phi_3$ and $\phi_1$. In the direction normal to the direction of charge transport and parallel to the opposite major sides of the n-type layer 202 the electrodes $\phi_1$, $\phi_2$ and $\phi_3$ extend completely across the entire width of the portion 207 of the layer 202 defined between the oppositely located strip parts of the p$^+$-region 206. The electrodes $\phi_1$ are permanently interconnected and consist of doped polycrystalline silicon layer parts present on the insulating material 204 at a first level. The electrodes $\phi_3$ are permanently interconnected and consist of doped polycrystalline silicon layer parts present on the insulating material 204 and are at a second level where they overlap the electrodes $\phi_1$ at the first level. The electrodes $\phi_2$ can be permanently interconnected or separately accessible depending on the particular operational phase as will be described hereinafter and consist of aluminium layer parts present on the insulating material 204 and are at a higher level where they overlap the electrodes $\phi_1$ and $\phi_3$.

Situated within the portion 207 of the layer 202 there are p$^+$-diffused island surface regions 209, one such region 209 being provided for each group of three charge transfer electrodes $\phi_1$, $\phi_2$ and $\phi_3$. The p$^+$-regions 209 which in the present embodiment are centrally situated within the portion 207 have the same doping and depth as the p$^+$-region 206. In the direction of charge transport they are of the same dimension as the associated electrodes $\phi_2$ and are substantially in registration with said electrodes $\phi_2$. In the insulating material 204 centrally situated above the p$^+$-regions 209 there are contact windows 210 via which the electrodes $\phi_2$ contact the p$^+$-diffused regions 209.

In the n-type layer portion 207 there are further surface regions 211 which are more highly doped with ion implanted donor impurities and serve, as described with reference to some of the previously described embodiments, for determining the potential distribution in the layer portion 207 so that the storage of information represented by electrons in the interior of said layer portion 207 below an electrode $\phi_2$ is concentrated only under the more highly doped surface portions 211. The ion implanted donor concentration is localized so that in the direction of charge transport the regions 211 extend only as far as the opposing spaced edges of the electrodes $\phi_1$ and $\phi_3$. In a direction parallel to the surface of the layer 202 and normal to the direction of charge transport the ion implanted donor concentration is localized so that the portions 211 extend only as far as the opposing edges of the p$^+$-region 206 and the p$^+$-regions 209.

Charge transport of electrons can be effected via the interior of the layer by applying appropriate clocking voltages to the electrodes $\phi_1$, $\phi_2$ and $\phi_3$. In the present example the so-called two and one half phase clocking is employed with the electrodes $\phi_2$ at a constant voltage of zero volts for the charge transfer operation and the clocking voltages applied to the electrodes $\phi_1$ and $\phi_3$ varying between +5 volts and +15 volts. The substrate is at earth potential and via a connection (not shown) to the portion 207 of the n-type layer 202 a potential of +15 volts is applied. The p$^+$-region 206 is maintained at a constant potential of +5 volts.

In the present embodiment the p$^+$-region 206 constitutes the common source region of a plurality of insulated gate field effect transistor structures of which the drain regions are formed by the individual p$^+$-island regions 209. Thus at any one instant in the clocking sequence when an information representing charge packet of electrons is below an electrode $\phi_2$ and as described confined to below the more highly doped portion 211 in the n-type layer portion 207 a signal representative of the size of said charge packet can be obtained via the main current path of the transistor structure associated with the particular electrode $\phi_2$. In the present embodiment the transistor structures have the gate electrodes constituted by the electrodes $\phi_2$ connected to the drain regions which are formed by the p$^+$-regions 209. Thus for the read-out of such a charge packet of electrons, with a fixed potential on the gate forming electrode $\phi_2$, the magnitude of the transistor surface current of holes between the source forming region 206 and the relevant drain region 209 will be determined, by the magnitude of the charge packet of electrons stored in the interior of the n-type layer portion 206 below the transistor channel which in area is in registration with the two overlying ion implanted more highly doped surface regions 211 of the particular transistor structure.

For the read-out the electrodes $\phi_2$ are separately accessible via suitable switching means and the relevant electrode $\phi_2$ connected to a fixed potential of zero volts via a resistor R. For operation as a tapped delay line a certain charge packet is non-destructively sampled at each of a plurality of successive CCD transfer bits during its passage along the CCD channel from the input to the output, said sampling being provided by the field effect transistor structure read-out means at each bit.

It is thus evident that the provision of the field effect transistor structure read-out means in each bit of the CCD line can readily be achieved in a simple manner. In the last described embodiment each read-out transistor structure is constructed with the transistor drain region connected to the associated transistor gate electrode. However this is not essential and the structure can be modified to provide a separate connection to each of the transistor source and drain regions. Thus any of the structures with individually accessible source and drain regions as previously described can be employed. Furthermore alternative means whereby the information representing charge packet is confined in the interior of the layer to a position in registration with the overlying transistor channel may be employed and embodying the features previously described. Thus in one example in which no additional more highly doped surface regions are essentially required for obtaining the desired confinement of the CCD charge packet, the transistor gate electrodes which also constitute one group of the clocking electrodes have a central opening which provides access for connection to an island surface region forming the transistor source region. This corresponds to a multi-stage read-out adaptation of the structure shown in FIGS. 11 and 12, it being noted that it is not essential to provide a separate source of clock voltages for the read-out stages, in each bit the input and output electrodes simply being constituted by the normal clocking electrodes as is also the gate electrode.

It will be appreciated, as previously described, that the provision of non-destructive read-out means at each CCD bit in a CCD line of a bulk channel device can have many applications. Such applications are by no means limited to signal processing in the sense of there being only a conversion of electrical signals into a packet of majority charge carriers at an input of the CCD line and a subsequent re-conversion into an electrical signal at the output of the CCD line because the novel read-out means may be employed to provide an access to the particular CCD bits where they are incorporated either singly or simultaneously. One example of the former case of single access is the use of the device in some form of memory application where the information to be stored in the form of discrete packets of charge in each bit is first introduced at the CCD input by conversion from electrical signals and then located in each bit by the normal CCD transfer operation. In the other form of operation where each bit is simultaneously read out one example is a display device where charge information as first introduced into each bit in the CCD line is converted into a, for example visible, radiation pattern by means provided in series with the main current path of each read-out transistor channel. For a full description of the means whereby such a radiation pattern can be produced by providing electroluminescent material in series with the main current path of a deep depletion field effect transistor structure incorporated at each bit of a surface channel CCD reference is invited to our co-pending Application No. 55563/72 which corresponds to U.S. application Ser. No. 419,435. However it is mentioned here that the structure herein described has considerable advantages compared with the structures described in Application No. 55563/73 at least in so far as the provision of the read-out transistor channel may be achieved in a more compact form and the speed of operation may be faster.

Another possibility of application of a device in which a plurality of bits in a CCD line are individually accessible is in a form of imaging device in which the charge packets are generated in the same semiconductor body as the CCD line, for example by the normal CCD imaging action, and can be individually read out without the necessity of having to transfer the charge packets to output means at the end of the CCD line as occurs in a normal CCD imaging device. Thus a form of random access optical storage device may be formed. Such a device in the form of a photosensitive random access memory may have applications in optical character recognition. A further modification is one where the imaging of a scene or some form of optical input is multiplexed with electrical signal information introduced into the CCD line via an input stage.

Another possible area of application is in image intensification and in this respect reference is further invited to our co-pending Application No. 55563/72.

The single line CCD structure shown in FIGS. 18 to 20 and the described modifications thereof may be readily adapted to form a multi-line device comprising an array of CCD bits each individually accessible. Such a device may be constructed in a particular way dependent on the particular application and the previous reference to the various applications of the single line structure all correspondingly apply. In particular for memory applications or display applications the device structure may be compact and provide significant advantages.

An embodiment of a random access memory device will now be described with reference to FIGS. 21 and 22. This device is the adaptation of the single line structure shown in FIGS. 18 to 20 in an array in which each 'memory' bit is individually accessible by $x$, $y$, addressing means. Thus in FIGS. 21 and 22 layer parts and regions corresponding to those present in the single line device shown in FIGS. 18 to 20 are indicated by the same reference numerals.

The device shown in FIGS. 21 and 22 comprises a plurality of the CCD lines which in the $x$ direction are parallel arranged so that in the $y$ direction the CCD bits are also arranged in columns. The clocking electrodes $\phi_1$, $\phi_2$ and $\phi_3$ are common for all the CCD lines and thus information in the form of charge packets of electrons introduced at input stages at the end of each CCD line can be clocked along the various lines simultaneously. Instead of a single $p^+$-surface region, that is a region such as region 206 in the embodiment described with reference to FIGS. 18 to 20, for laterally bounding the CCD channels and for providing part of the isolation thereof in operation, a plurality of $p^+$-surface regions are present for this purpose in the present embodiment. In FIGS. 21 and 22 such $p^+$-regions 215, 216 and 217 are shown. These $p^+$-regions can be all interconnected for the charge transfer part of the device operation and can be individually accessed for the memory read-out part of the device operation. Similarly the electrodes $\phi_2$ can be all interconnected for the charge transfer or can be individually accessed for the read-out. The charge transfer part of the operation is as described in the previous embodiment with the exception that the confinement of the stored electrons when under an electrode $\phi_2$ to only a certain part of the CCD channel below said electrode is modified in conjunction with the requirement to use the $p^+$-lines bounding the CCD channels, such as the $p^+$-regions 215, 216, 217, as transistor source regions with unidirectional current flow.

Consider any one memory bit, for example the memory bit in the upper left-hand side of FIG. 21. This memory bit is constituted by parts of three adjacently situated electrodes $\phi_1$, $\phi_2$, $\phi_3$ and the portion 207 of the n-type epitaxial layer 202 below said electrode parts and defined between the $p^+$-regions 215 and 216. Associated with said memory bit is the transistor drain region 209 centrally situated in said part 207 of the epitaxial layer. In this bit information in the form of electrons is to be stored in the interior of the layer portion 207 below the electrode $\phi_2$. For the read-out it is arranged that the $p^+$-region 215 is used for the $y$ addressing of the transistor structures associated with memory bits in the CCD line situated between the $p^+$-regions 215 and 216, the $p^+$-region 216 is used for the $y$ addressing of the transistor structures associated with the memory bits in the CCD line situated between the p+-regions 216 and 217, and so on. In every case the relevant p+-region 215, 216 or 217 constitutes the transistor source and the relevant p+-region 209 constitutes the transistor drain. Thus for any one such region 215, 216 or 217 acting as a source region, unidirectional current flow to the relevant drain region has to be ensured. This is achieved together with the achievement of the desired confinement of the charge packet to below only part of the electrode $\phi_2$ by in each bit providing, instead of two more highly doped surface regions 211 as in the previously described embodiment, only a single more highly doped surface region 211 which is present at the side of the central drain region 209 facing the respective p+-region at one lateral boundary of the CCD channel and which is to form the source region, together with the provision on the other side of the central drain region 209 of means for increasing the threshold voltage in order to prevent current flow between the drain region and the p+-region situated at the lateral boundary of the CCD channel at said other side of the drain region. In the present embodiment the means to increase the threshold voltage consists of the provision of parts 219 of the insulating layer of greater thickness in the said areas. These parts 219 on which the electrodes $\phi_2$ are situated are shown with shading lines in the plan view of FIG. 21 and the boundaries of the more highly doped surface regions 211 are indicated by a line of dots.

Thus in the said one memory bit located at the top left-hand side of FIG. 21 the source region of the read-out transistor structure is formed by the P+-region 215, the drain region by the p+-region 209 and the transistor channel is formed in the single more highy doped region 211 below which and in registration with an information representing charge packet of electrons can be stored.

In the operation of the memory device, in the charge transfer operation for the writing of the memory information the p+-line regions are maintained at earth potential. Using the so-called two-and-one-half phase clocking the potentials applied to the electrodes $\phi_1$ and $\phi_3$ vary between +5 volts and +15 volts with the electrodes $\phi_2$ maintained at earth potential. The substrate 201 is at earth potential and via connections (not shown) to the parts 207 of the n-type epitaxial layer in which the CCD channels are present a potential of +15 volts is applied. Read-out is effected using the individually accessible p+-line regions such as the regions 215, 216 and 217 shown in FIG. 21 for the y-addressing and the individually accessible electrodes $\phi_2$ for the x-addressing. For read-out, for example of the information in the memory bit present at the top left-hand side of FIG. 21 the potential applied to the $p^{30}$-region 215 is +5 volts while all the other parallel extending p+-regions are maintained at zero volts and isolated from the p+-region 215 and the potential applied via a load resistor R to the respective electrode $\phi_2$ forming the transistor gate electrode is zero volts while all the other electrodes $\phi_2$ are maintained at zero volts and isolated from the said respective electrode $\phi_2$. Amplified output signals $V_{out}$ can be obtained as indicated when performing such a read-out of an individual memory bit.

It will be appreciated that the device further comprises means at the ends of the CCD channels whereby during the read-out operation isolation of the CCD channels is still maintained, for example by depletion regions formed under negatively biased NOS electrodes running transversely across the CCD channels.

In the memory embodiment described with reference to FIGS. 21 and 22 the size of the memory cells is relatively small, the pitch distances between adjacent cells being 25 microns in both directions. This is comparable with current silicon gate memory circuits of the kind having one transistor and an inversion layer capacitor per bit. However the structure described is readily capable of a reduction in size with the inherent advantage that such reduction is not accompanied by a reduction in the output current from the insulated gate field effect transistor structure read-out means since the reduction in the size of the charge packet is offset by the reduction in gate capacitance, while the reduction in transistor gate width is offset by the reduction in gate length. Thus when using, for example, electron or X-ray lithography, a very high capacity memory can be made.

The memory devices herein described represent an improvement over the previously referred-to memory circuit described in our co-pending Application No. 55563/72 in which a real binary system is possible because it is not essential to have any bias charge to obtain a good transfer efficiency. In a preferred mode of operation of the device described with reference to FIGS. 21 and 22 the aluminium electrodes $\phi_2$ are held at a constant voltage of zero volts during both the writing and read-out operations. During a read-out operation both the source and drain are maintained at earth potential the transistors are non-conducting and only become conductive when a positive voltage of +5 volts is applied to the relevant p+-region, for example the region 215 for the described memory bit, and when a charge packet (electrons) is present below the transistor channel. In this manner the absence or presence of a current at the output indicates the absence or presence of charge in the addressed bit which indicated respectively the presence of a 'zero' or a 'one'.

With the described memory device structure in which a plurality of bulk channel CCD lines are arranged as an array of memory bits each provided with a field effect transistor structure read-out means integrated in each bit various possibilities exist for the use of the device. Furthermore analog information may be stored and read in such a memory device.

It will be appreciated that many modifications may be made in the described memory device. For example the structure may be suitably adapted, similarly as described with reference to FIGS. 18 to 20, to employ various different structural features as are present in the previously described embodiments, for example there may be employed other means for obtaining the confinement in the interior of the layer of the charge packets below certain electrodes only to a part of the total area of the layer part in which the CCD channel is formed. The device structure may be suitably adapted to provide a random access CCD memory in which the charge transfer via the interior of the semiconductor layer is effected with, for example two-phase, conventional three-phase or four-phase clocking. Furthermore in the embodiment described with reference to FIGS. 21 and 22 the desired unidirectional transistor current flow is obtained by locally increasing the threshold voltage adjacent a surface part of each memory bit by employing an insulating layer part of increased thickness. Other means may be employed for this purpose consistent with obtaining the desired potential distributions in the layer to achieve the desired charge confinement. Thus in the embodiment described with reference to FIGS. 21 and 22 the combination of the single more highly doped ion implanted surface region 211 and the thicker-insulating part 219 below an electrode $\phi_2$ at opposite sides of the p$^+$-drain region 209 provides a difference in surface potentials in the associated parts of the layer 207 whereby for the transistor action one part only in inverted, namely the surface part of the region 211, and also provides a difference in the potentials in the associated interior parts of the layer 207 whereby for the charge packet (electrons) confinement one interior part, namely the interior part directly below the region 211, is more positive then the other interior part. This requirement may thus alternatively be achieved, for example, using different ion implantation steps in the two different surface parts, one a deep implant to make the interior of the layer more positive with a relatively small increase in the threshold voltage and the other a high concentration shallow implant to produce a relatively large increase in the threshold voltage without producing a substantial change in the potential in the interior of the layer. Any such means for threshold voltage control and charge confinement may be employed, where desired, in modifications of the embodiments previously described.

In the diagrammatic drawing of FIGS. 21 and 22 the thicker silicon oxide layer parts 219 are shown having boundaries, in the direction of charge transport, which coincide with the edges of the p$^+$-drain regions 209 and the p$_+$-line regions 215, 216, 217. In practice the thicker oxide layer parts will slightly overlap the edges of said P$^+$-regions.

A further embodiment of a charge coupled device will now be described with reference to FIGS. 23 and 24. This device is an image display device in which video signals are converted into charge packets at the inputs of a plurality of parallel-arranged buried channel CCD lines, the charge packets are clocked along the CCD lines to storage sites and at each such storage site a liquid crystal visible display of an intensity representative of the stored charge packet is provided adjacent the location of the storage site. The structure in each CCD line is similar to that of the embodiment described with reference to FIGS. 18 to 21 and corresponding parts and regions are indicated by the same reference numerals. In this device in which the semiconductor body is also of silicon the clocking electrodes $\phi_1$ and $\phi_3$ are formed by doped polycrystalline silicon layer parts, these electrodes extending in a direction at right angles to the bulk channel CCD lines and thus forming common clocking electrodes for all the CCD lines. The clocking electrodes $\phi_2$ are formed of aluminium layer pars 231 of 20 microns × 25 microns surface dimensions, said layer parts being present as islands and contacting the read-out transistor p$^+$drain regions 209. The isolation of the CCD channels 207 in the epitaxial layer is provided by p$^+$-regions 206 which in the present example are of 10 microns width and are all interconnected. The upper surfaces of the electrodes $\phi_1$ and $\phi_3$ where not overlaid by the aluminium electrodes $\phi_2$ are covered by insulating material. On the upper surface of the insulating material on the semiconductor body surface and on the electrodes $\phi_1$ and $\phi_3$ and on the upper surfaces of the aluminium electrode layer parts 231 there is a layer of liquid crystal material 234 having a relatively low lateral conductance and a relatively high transverse conductance. The upper surface of the liquid crystal layer 234 is bounded by a glass plate 236 coated on its lower surface by a semi-transparent electrode layer 235, of a metal oxide, for example tin oxide.

In one possible operational mode, for the charge transfer operation using the so-called two and one half phase clocking and for the display a fixed negative potential of for example −10 volts is applied to the metal oxide electrode layer 235 and a fixed positive potential of for example +5 volts is applied to the p$^+$-regions 206. This determines the potential on the aluminium electrode layer parts $\phi_2$ in accordance with the requirements of current continuity through the transistor channels and the associated display elements. The substrate 201 is at earth potential, the potential applied to the portion of the n-type layer in which the CCD channels are present being +15 volts. The clocking voltages applied to the electrodes $\phi_1$ and $\phi_3$ for the charge transfer along the CCD lines via the interior parts 207 of the layer vary between 0 and +10 volts.

In this device each read-out transistor associated with the electrode $\phi_3$ of each CCD transfer bit has a source region formed by the p$^+$-lines 206, a centrally situated p$^+$-drain region 209, and a channel region in two parts extending on opposite sides of the drain region 209. The gate electrodes are formed by the aluminium electrodes $\phi_2$ which are shorted to the respective drain regions 209. Two ion implanted more highly doped surface regions 211, as in the embodiment described with reference to FIGS. 18 to 21, are present in each CCD transfer bit below the electrode $\phi_2$ in order to provide for the concentration of a stored charge packet of electrons to below the transistor channel region parts.

Read-out in the form of the production of a visible display at each display element provided in the liquid crystal material in series with the transistor drain region 209 is obtained by permitting the charge packets to remain stationary when below the appropriate electrodes $\phi_2$ for a period which is large in comparison with the period during which the charge transfer is effected.

It will be appreciated that many further modifications are possible. Thus, for example, as an alternative to the use of liquid crystal material for the display in the device described with reference to FIGS. 23 and 24, an electroluminescent material may be employed. Also for the semiconductor layer in which charge storage and transport is effected materials other than silicon may be used. Furthermore the conductivity types of the various regions and layers may all be reversed.

In the embodiments described with reference to FIGS. 18 to 20, FIGS. 21 and 22, and FIGS. 23 and 24 each read-out transistor is formed with the gate electrode connected to the drain region. However other structures may be formed where the transistor drains are separatedly accessible in each charge storage and transfer bit.

The device structures of the form described with reference to FIGS. 18 to 20 and FIGS. 21 and 22 may be suitably incorporated in a device in which additive outputs from one charge transfer line are provided along another charge transfer line. By such means and using various signal processing techniques analogue operational possibilities are provided.

It will be appreciated that the semiconductor devices in accordance with the invention can be manufactured by conventional techniques and in particular many of the embodiments of the charge coupled devices described can be manufactured with few, if any, additional process steps than are normally required in the manufacture of charge coupled devices.

What we claim is:

1. A semiconductor device comprising a semiconductor body having a semiconductor layer of one conductivity type, means for enabling the semiconductor layer to be locally fully depleted without avalanche multiplication in order to allow the movement of majority charge carriers representative of information via the interior of the layer to one or more storage sites in the layer, means for enabling the reading of information present at least in one storage site comprising an insulated gate field effect transistor structure having its channel region present at the surface of the semiconductor layer above said one storage site and between source and drain regions of the opposite conductivity type, and means for enabling the temporary confinement of the quantity of majority charge carriers in said one storage site to the interior of the layer without mixing of the stored charge carriers in said one storage site and the mobile minority charge carriers in the transistor channel in order that the current flow in the transistor channel when the transistor gate electrode is maintained at ay given potential is dependent upon the quantity of charge in the said one storage site.

2. A semiconductor device having a semiconductor body comprising a semiconductor layer of one conductivity type, in which means are present to isolate the semiconductor layer from its surroundings and said layer has a thickness and doping concentration at which a depletion layer can be obtained throughout the thickness of the semiconductor layer by means of an electric field while avoiding breakdown, means for enabling the local introduction into the layer of electrical charge representaive of information and in the form of majority charge carriers, means for enabling the reading of said charge in the layer, and an electrode system for the capacitive generation of electric fields in the semiconductor layer being present adjacent at least one side of the layer and by means of which the charge can be transported via the interior of the layer to the reading means and at least during the reading confined to the interior of the layer, said reading means comprising an insulted gate field effect transistor structure having source and drain regions formed by first and second regions of the opposite conductivity type adjoining the surface of the layer and a gate electrode overlying and insulated from the layer, the gate electrode forming part of the said electrode system for generation of electric fields, the first and second regions and the gate electrode defining a current carrying channel region of the transistor in a surface part of the layer to below which the charge to be read can be transported and confined without mixing of the majority charge carriers thus transported and the mobile minority charge carriers in the transistor channel.

3. A semiconductor device as claimed in claim 2, wherein the device is a charge coupled device comprising at least one charge transfer line in which majority charge carriers can be transported between successive storage sites in the line via the interior of the semiconductor layer in a lateral direction parallel to two opposite major sides of the layer, at least one of the storage sites having associated therewith said means for enabling the reading of information in the layer and comprising an insulated gate field effect transistor structure.

4. A charge coupled device as claimed in claim 3, wherein at least one of the surface regions of the opposite conductivity type forming the source and drain of the transistor belonging to the reading means is a region forming part of means for isolating the semiconductor layer from its surroundings.

5. A charge coupled device as claimed in claim 4, wherein in a direction transverse to the direction of charge transport the semiconductor layer is at least partly laterally bounded along one side by a surface region of the opposite conductivity type, said region forming one of said first and second regions constituting the source and drain of the transistor.

6. A charge coupled device as claimed in claim 5, wherein the other of said regions of the opposite conductivity type is formed by an island surface region of the opposite conductivity type situated in and surrounded by the layer of the one conductivity type.

7. A charge coupled device as claimed in claim 6, wherein the transistor gate electrode extends across the entire width of the semiconductor layer and overlaps the entire periphery of the island surface region of the opposite conductivity type.

8. A charge coupled device as claimed in claim 7, wherein the semiconductor layer of the one conductivity type comprises a more highly doped surface portion extending throughout the layer.

9. A charge coupled device as claimed in claim 6, wherein the transistor channel extends only across part of the width of the semiconductor layer, which part lies between the island surface region of the opposite conductivity type and the surface region of the opposite conductivity type at least partly laterally bounding the semiconductor layer along said one side.

10. A charge coupled device as claimed in claim 9, wherein means are present to cause a diversion of the charge transported via the interior of the semiconductor layer to the interior of that part of the layer comprising the transistor channel and situated between the island surface region of the opposite conductivity type and said surface region of the opposite conductivity type at least partly laterally bounding the semiconductor layer along one side and to simultaneously confine both the majority charge carriers in a charge packet in the interior of said part of the layer and the mobile minority charge carriers flowing at the surface of said part of the layer between the source and drain to the same portion of said part of the layer.

11. A charge coupled device as claimed in claim 10, wherein said diversion means comprises a locally formed more highly doped surface region of the one conductivity type in said part of the layer.

12. A charge coupled device as claimed in claim 10, wherein said diversion means comprises a locally formed more highly doped surface region of the one conductivity type in said part of the layer and a screening electrode present above and insulated from a part of the layer between the island surface region of the opposite conductivity type and the lateral boundary of the semiconductor layer along the side opposite said one side.

13. A charge coupled device as claimed in claim 6, wherein in a direction transverse to the direction of charge transport the semiconductor layer is at least partly laterally bounded along both sides by a common surface region of the opposite conductivity type forming said one of said first and second regions.

14. A charge coupled device as claimed in claim 5, wherein in a direction transverse to the direction of charge transport the semiconductor layer is laterally bounded along opposite sides by a pair of surface regions of the opposite conductivity type which constitute said regions forming the source and drain of the transistor, the gate electrode extending across the entire width of the semiconductor layer between said surface regions and means being present for producing a simultaneous confinement of the stored charge carriers in the interior of the layer and the transistor surface current to a part of the layer below the gate electrode.

15. A charge coupled device as claimed in claim 14, wherein the means for producing said confinement comprises a more highly doped surface region of one conductivity type in said part of the layer below the gate electrode.

16. A charge coupled device as claimed in claim 3, wherein both of said regions of the opposite conductivity type forming the transistor source and drain regions are located entirely within the layer of the one conductivity type, means being present for causing a diversion of the charge transported via the interior of the layer to the interior of the part of the layer situated between said regions of the opposite conductivity type and also the simultaneous confinement of the transistor surface currnet and the stored charge in the interior of the layer to the same portion of sid part of the layer between said regions of the opposite conductivity type.

17. A charge coupled device as claimed in claim 16, wherein said diversion means comprises a more highly doped surface region in said part of the layer and at least one screening electrode.

18. A charge coupled device as claimed in claim 3, wherein the insulated gate field effect transistor read-out means is present at each of a plurality of successively situated charge storage and transfer bits of the charge transfer line.

19. A charge coupled device as claimed in claim 18, wherein the device comprises at least one individual charge transfer line having an individually associated group of electrodes to which voltages can be applied for effecting the charge transfer.

20. A charge coupled device as claimed in claim 18, wherein the device comprises a plurality of parallel situated charge transfer lines with groups of electrodes to which voltages can be applied for effecting charge transfer in the plural charge transfer lines.

21. A charge coupled device as claimed in claim 20, wherein the charge storage and transfer bits in the plurality of lines comprise an array of memory cells in which for each memory cell an individually associated read-out insulated gate field effect transistor structure is present, means being present for the random access of the information in the memory cells via said read-out insulated gate field effect transistor structures.

22. A charge coupled device as claimed in claim 21, wherein associated with the portion of the semiconductor layer in which a memory cell and associated transistor are present there are means for controlling the potential distribution both at the surface of the layer and in the interior of the layer for obtaining confinement of a charge packet of majority carriers in the interior of the layer below and in registration with a first surface part overlaid by the transistor gate electrode and in which the transistor channel current flows and for inhibiting, by increasing the threshold voltage, transistor current flow in a second surface part overlaid by the transistor gate electrode.

23. A charge coupled device as claimed in claim 20, wherein the device is an image display device having means associated with the layer for converting video input signals into a charge pattern which can be transferred in the form of majority charge carriers via the interior of the layer to the charge storage and transfer bits having individually associated insulated gate field effect transistor structures, display means being provided in series with the main current paths of said transistors for providing an output representative of the amount of charge present at the respective storage site.

24. A charge coupled device as claimed in claim 3, wherein the electrode system provided for the capacitive generation of electric fields in the semiconductor layer in order to effect the charge transfer comprises a group of electrodes separately associated with the charge reading means and to which group the gate electrode of the read-out insulated gate field effect transistor structure belongs.

25. A charge coupled device as claimed in claim 24, wherein means are prsent for separately associating said group of electrodes with a first source of clock voltages and for associating other groups of electrodes provided for the charge transfer with a second source of clock voltages.

26. A charge coupled device as claimed in claim 25, wherein said group of electrodes associated with the charge reading means consists of three electrodes of which in the direction of charge transport the gate electrode is situated between the other two electrodes.

27. A charge coupled device as claimed in claim 26, wherein means are present for connecting the gate electrode to a reference potential.

28. A charge coupled device as claimed in claim 25, wherein in the direction of charge transport following the last electrode of said group of electrodes separately associated with the reading means there is present charge draining means.

29. A charge coupled device as claimed in claim 25, wherein in the direction of charge transport following the last electrode of said group of electrodes separately associated with the reading means a further electrode system is present for the further transfer of the charge to a third part of the layer via the interior of the layer.

30. A charge coupled device as claimed in claim 25, wherein means are present for connecting the electrodes preceding the group of electrodes associated with the reading means to a three-phase source of clock voltages.

31. A charge coupled device as claimed in claim 30, wherein the said preceding electrodes are arranged in groups of three and in each group the three electrodes are of polycrystalline silicon spaced from the surface of the semiconductor layer by insulating layer parts of different thickness.

32. A semiconductor device as claimed in claim 2, comprising at least one photo-detector element, in which the first region of the opposite conductivity type is laterally bounded in the layer of the one conductivity type by the second region of the opposite conductivity type, means being present for enabling radiation to be absorbed in a depletion region when formed extending at least throughout the thickness of the layer in the part thereof between said first and second regions of the opposite conductivity type, the electrode system comprising at least two electrodes situated above said part of the layer and together forming separated parts of the transistor gate electrode, majority charge carrier draining means being present for enabling the removal of radiation generated free majority charge carriers from the said part of the layer after their collection and storage in the interior of the layer below one of the electrodes belonging to the said electrode system.

33. a semiconductor device as claimed in claim 32, wherein said majority charge carrier draining means comprises an opening in the second region of the opposite conductivity type which forms a narrow channel of the one conductivity type in the layer between the said part thereof between the first and second regions of opposite conductivity type and a further part of the layer situated beyond the second region of the opposite conductivity type, and a conductive connection to said further part of the layer.

34. A charge coupled device comprising a semiconductor body having a semiconductor layer of one conductivity type, means for enabling the semiconductor layer to be locally fully depleted without avalanche multiplication in order to allow the transfer of majority charge carriers representative of information between storage sites via the interior of the layer, one or more of the storage sites each having associated therewith separate means for enabling the reading of said information, each reading means comprising an insulated gate field effect structure having its channel region present at the surface of the semiconductor layer above the storage bits and between source and drain regions of the opposite conductivity type, and means for enabling the temporary confinement of the quantity of majority charge carriers in the storage site to the interior of the layer without mixing of the stored majority charge carriers in the storage site and the mobile minority charge carriers in the transistor channel in order that the current flow in the transistor channel when the gate electrode is maintained at any given potential is dependent upon the quantity of charge in the said one storage site.

* * * * *

UNITED STATES PATENT OFFICE
CERTIFICATE OF CORRECTION

Patent No. 4,074,302   Dated February 14, 1978

Inventor(s) Robert J. Brewer

It is certified that error appears in the above-identified patent and that said Letters Patent are hereby corrected as shown below:

Col. 1, line 51, "transfer" should read -- transistor --.

Col. 2, line 23, "theme" should read -- there --.

line 25, "intermediate" should read -- indeterminate --.

Col. 5, line 5, after "the" insert -- temporary confinement of --.

line 61, "surfade" should read -- surface --.

Col. 8, line 7, before "simple" insert -- relatively --.

Col. 17, line 12, "$\phi_4 - \phi_4$" should read -- $\phi_1 - \phi_4$ --.

Col. 18, line 15, "one" (first occurrence) should read -- on --.

Col. 20, line 16, "$\phi hd3$" should read -- $\phi_3$ --.

line 39, "signa" should read -- signal --.

line 42, delete "are".

UNITED STATES PATENT OFFICE
CERTIFICATE OF CORRECTION

Patent No. 4,074,302      Dated February 14, 1978

Inventor(s) Robert J. Brewer

It is certified that error appears in the above-identified patent and that said Letters Patent are hereby corrected as shown below:

Col. 20, line 52, "modifiction" should read -- modification --.

Col. 21, line 32, "whithin" should read -- within --.

Col. 25, line 7, "CCE" should read -- CCD --.

Col. 33, line 67, "NOS" should read -- MOS --.

Col. 39, line 23, "sid" should read -- said --.

line 65, "20" should read -- 18 --.

Col. 40, line 17, "prsent" should read -- present --.

Col. 42, line 7, "bits" should read -- site --.

Signed and Sealed this

Seventeenth Day of October 1978

[SEAL]

Attest:

RUTH C. MASON
Attesting Officer

DONALD W. BANNER
Commissioner of Patents and Trademarks